(12) United States Patent
Akamatsu

(10) Patent No.: US 6,728,149 B2
(45) Date of Patent: Apr. 27, 2004

(54) SEMICONDUCTOR MEMORY DEVICE

(75) Inventor: Hiroshi Akamatsu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/269,062

(22) Filed: Oct. 11, 2002

(65) Prior Publication Data

US 2003/0117872 A1 Jun. 26, 2003

(30) Foreign Application Priority Data

Dec. 26, 2001 (JP) ........................................ 2001-394114

(51) Int. Cl.⁷ ................................................ G11C 7/00
(52) U.S. Cl. ...................................... 365/200; 365/201
(58) Field of Search ................................ 365/200, 201, 365/185.09, 189.07; 714/7

(56) References Cited

U.S. PATENT DOCUMENTS 6,246,627 B1 * 6/2001 Yamauchi et al. .......... 365/229
6,367,030 B1 * 4/2002 Yamauchi ....................... 714/7
6,542,422 B1 * 4/2003 Furutani et al. ............. 365/200

\* cited by examiner

Primary Examiner—Tan T. Nguyen
(74) Attorney, Agent, or Firm—McDermott, Will & Emery

(57) ABSTRACT

A spare address conversion circuit makes an address assignment to spare sub word lines different from the address assignment to normal sub word lines between a mode of data writing and a mode of data reading. Data are written such that opposite data patterns are stored in spare word lines before and after address conversion. When a multi-selection occurs, there is data collision on the corresponding bit lines, so that the multi-selection can be detected without fail.

12 Claims, 15 Drawing Sheets

TE : L ; /RA0 TO NODE 55, RA0 TO NODE 57

( RA1, RA0 )

( 0, 0 ) ⟷ X0 ⟷ SSWL0

( 0, 1 ) ⟷ X1 ⟷ SSWL1

( 1, 0 ) ⟷ X2 ⟷ SSWL2

( 1, 1 ) ⟷ X3 ⟷ SSWL3

TE : H ; RA0 TO NODE 55, /RA0 TO NODE 57

( RA1, RA0 )

( 0, 0 ) ⟷ X1 ⟷ SSWL1

( 0, 1 ) ⟷ X0 ⟷ SSWL0

( 1, 0 ) ⟷ X3 ⟷ SSWL3

( 1, 1 ) ⟷ X2 ⟷ SSWL2

SEMICONDUCTOR MEMORY DEVICE

BACKGROUND OF THE INVENTION

1. Field of the Invention

The present invention relates to a semiconductor memory device, and more particularly to a semiconductor memory device having spare memory cells for repairing a defective bit. More specifically, this invention relates to a semiconductor memory device capable of accurately detecting a program failure in a program of a defective address.

2. Description of the Background Art

FIG. 24 is a schematic diagram showing a configuration of a main part of a conventional semiconductor memory device. In FIG. 24, the semiconductor memory device includes a normal array 900 having a plurality of normal memory cells arranged in rows and columns; a spare array 902 having spare memory cells for repairing a defective memory cell in normal array 900; a normal row selection circuit 904 for selecting a memory cell row in normal array 900 in accordance with an internal address signal intAD; a spare address program circuit 906 for storing a defective address of normal array 900, and for generating, when the defective address is designated by internal address signal intAD, a spare row enable signal SRE and designating a spare memory cell row of spare array 902; and a spare row selection circuit 908 for driving a corresponding spare memory cell row of spare array 902 to a selected state in accordance with the output signal of defective address program circuit 906.

When defective address program circuit 906 have defective addresses designating spare memory cells in a plurality of rows in spare array 902 programmed therein, signals indicating whether or not internal address signal intAD designates the defective addresses are generated for the respective programmed defective addresses, and the spare row enable signal SRE is generated from the OR operation of these signals. Spare word lines are arranged corresponding to the respective defective addresses.

When spare row enable signal SRE is activated, the row selecting operations by normal row selection circuit 904 is inhibited. When the address of a defective memory cell row is designated in normal array 900, a spare memory cell row in spare array 902 is driven to the selected state. The defective normal memory cell row is replaced by the spare memory cell row, and the defective memory cell row is repaired equivalently. Defective memory cell row is repaired to improve the product yield.

In spare array 902, besides a spare row for repairing a defective memory cell row, there is provided a spare column for repairing a defective memory cell column in normal array 900 through replacement.

FIG. 25 shows the configuration of a defective address program circuit disclosed, for example, in Japanese Patent Laying-Open No. 11-203888. In defective address program circuit 906 shown in FIG. 25, whether a defective address is designated or not is determined in accordance with row address bits RA0 to RAn and complementary row address bits /RA0 to /RAn.

In FIG. 25 defective address program circuit 906 includes N-channel MOS transistors TR0 to TRn receiving row address bits RA0 to RAn at their gates, respectively; N-channel MOS transistors ZTR0 to ZTRn receiving complementary row address bits /RA0 to /RAn at their gates, respectively; fuse elements FU0 to FUn connected between the respective MOS transistors TR0 to TRn and a determination node 912; fuse elements ZFU0 to ZFUn connected between the respective MOS transistors ZTR0 to ZTRn and determination node 912; and a P-channel MOS transistor 910 for precharging determination node 912 to a power supply voltage Vcc level in accordance with a precharge instruction signal ZPR. The spare row enable signal SREi is generated at determination node 912. Each source of MOS transistors TR0 to TRn and ZTR0 to ZTRn is connected to a ground node.

In defective address program circuit 906 shown in FIG. 25, the fuse element corresponding to the bit attaining H level when a defective address is designated is blown by an energy ray such as a laser beam. For example, when an address (RA0 . . . RAn)=(100 . . . 01) is defective, fuse elements FU0 and FUn and ZFU1 to ZFUn−1 are blown.

When there is no defective address, all the fuse elements are kept in the non-blown state.

The defective address program circuit is arranged for each spare row, and when spare row enable signal SREi is activated upon selecting a row, the corresponding spare row (word line) is driven to the selected state. To normal row selection circuit 904, the spare enable signal is generated in accordance with the OR operation of output signals SREi of the defective address program circuits provided for the respective spare rows.

In a precharge cycle, address bits RA0 to RAn and /RA0 to /RAn are all set at L level, and determination node 912 has a discharging path cut off and is precharged to a power supply voltage Vcc level by MOS transistor 910.

When a defective row address is designated in a row selecting operation, determination node 912 has no discharging path because the fuse element corresponding to the H level address bit is blown. Consequently, spare row enable signal SREi remains at H level, and spare row selection circuit 908 is activated to select the corresponding spare memory cell row in spare array 902.

Spare row enable signal SRE applied to normal row selection circuit 904 is activated in accordance with spare row enable signal SREi when a defective address is designated.

When an address other than the defective address is designated, the address bit, applied to the gate of the MOS transistor provided for a fuse element in the non-blown state out of fuse elements FU0 to FUn and ZFU0 to ZFUn, attains H level. Therefore, determination node 912 is discharged to the ground voltage level, and spare row enable signal SREi is driven to L level, and normal row selection circuit 904 selects a normal memory cell row in accordance with an internal address signal intAD. Spare row enable signal SREi is in the inactive state, and spare row selection circuit 908 remains in the inactive state.

The precharge instruction signal ZPR is activated in the stand-by cycle, and determination node 912 is precharged to the power supply voltage Vcc level. In the active cycle for selecting a memory cell, precharge instruction signal ZPR is at H level, and MOS transistor 910 remains non-conductive.

When programming a defective address, if the fuse elements are correctly blown, spare row enable signal SRE (SREi) attains either the power supply voltage Vcc level or the ground voltage level, depending on whether a defective address is designated or not. Thus, a defective memory cell is reliably replaced by a spare memory cell, to repair the defect.

When the blowing of fuse elements FU (FU0 to FUn) or ZFU (ZFU0 to ZFUn) is made unsuccessfully, even if a defective address is designated, spare row enable signal SRE (SREi) attains L level, and a spare memory cell is not selected. As a result, the defective row is not replaced by spare memory cells, and failure repairing is not made. In this case, the program failure of a defective address can be detected by testing the products before shipment.

However, when the blowing of the fuse elements is done incompletely, a small amount of current flows via the incompletely blown fuse element.

FIG. 26 is a diagram showing an example of a fuse element in an incompletely blown state. In FIG. 26, a fuse element FUi is incompletely blown and still partly connected. Under this condition, when an H level address bit is applied to the corresponding MOS transistor TRi, a minute current I flows from determination node 912 to the ground node.

When the defective address is designated, minute current I falls spare row enable signal SRE (SREi) to an intermediate voltage level, and there is caused the following two cases, depending on the voltage level of the spare row enable signal; spare row selection circuit 908 is activated to perform a spare row selecting operation, and normal row selection circuit 904 is activated to perform a normal row selecting operation. Since a defective memory cell is repaired in some cases and not repaired in the other cases, an intermittent defect occurs in the operation. This intermittent defect occurs in a defective address, so that it can also be detected through a test using various test patterns.

When spare row enable signal SRE is at an intermediate voltage level, both spare row selection circuit 908 and normal row selection circuit 904 might be put in the activated state depending on this voltage level, thereby causing a multi-selection (multiple selection of word lines) in which a defective normal word line and a spare word line are both driven to the selected state.

FIG. 27 is a schematic diagram showing the arrangement of memory cells on a normal word line NWL and a spare word line SPWL. In FIG. 27, bit lines BL0, /BL0 to BLm, /BLm are arranged in the direction crossing normal word line NWL and spare word line SPWL. These bit lines BL0, /BL0 to BLm, /BLm are disposed in pairs. Normal memory cells NMC are arranged corresponding to crossings of normal word line NWL and bit lines BL0, /BL1, . . . , /BLm. Spare memory cells SMC are arranged corresponding to crossings of spare word line SPWL and bit lines BL0, /BL1, . . . , /BLm.

In general, memory cells MC are arranged in a matrix of rows and columns in a memory cell array, the memory cells MC connected to the normal word line are used as normal memory cells NMC, and the memory cells connected to spare word line SPWL are used as spare memory cells SMC. In such a memory array, spare memory cells SMC and normal memory cells NMC are arranged forming a successive pattern.

Now, the case is considered where a defective normal word line NWL and spare word line SPWL are selected at the same time under the condition that defective normal word line NWL is the same in arrangement of associated memory cells as spare word line SPWL. In this case, the data stored in normal memory cells NMC and spare memory cells SMC are read out on the same bit lines. Furthermore, when a multi-selection occurs, data of the same logical level are written into and read out of spare memory cells SMC and normal memory cells NMC, making it impossible to identify the occurrence of a multi-selection.

In order to identify the presence or absence of a multi-selection, it is required to write data of different logical levels to a normal memory cell NMC and a spare memory cell SMC. In this case, it is necessary that after a defective address is programmed, a defective normal word line NWL is forcibly put into the selected state for writing a certain data pattern and a spare word line is forcibly driven into a selected state for writing a data pattern of logical levels opposite to the certain data pattern written to defective normal word line NWL.

In the case where a defective word line and the corresponding spare word line have different patterns of connected memory cells from each other, the memory cells on one word line are connected to bit line BL and the memory cells on the other word line are connected to complementary bit line /BL. Therefore, when a multi-selection occurs, the normal and the spare memory cells store data of opposite logical levels, and data read out has the same logical level as written data, which makes it impossible to detect a multi-selection.

Thus, when testing is performed by writing various data patterns, a defective address must be stored and a data pattern of logical levels inverse to the data pattern written to the defective address has to be written to spare word line SPWL only for detection of a multi-selection. In other words, data patterns of opposite logical levels are required to be written to a spare word line and the corresponding defective normal word line. When detection of a multi-selection is performed at the same time as the test for detecting the presence of memory cell leakage by storing various data patterns in memory cells, there arises a problem that the data patterns are restricted, and test data patterns are limited.

SUMMARY OF THE INVENTION

An object of the present invention is to provide a semiconductor memory device capable of reliably detecting whether a defective address program is being accurately performed.

Another object of the present invention is to provide a semiconductor memory device capable of accurately detecting whether a multi-selection of word lines occurs.

A semiconductor memory device according to the present invention includes: a plurality of normal memory cells arranged in rows and columns; a plurality of normal word lines arranged corresponding to the respective normal memory cell rows and connecting normal memory cells in the corresponding rows; a plurality of spare memory cells arranged in rows and columns with the columns shared with the normal memory cells; a plurality of spare word lines arranged corresponding to the respective spare memory cell rows and connecting spare memory cells in the corresponding rows; and a defective address program circuit for programming the address of a defective normal word line. This defective address program circuit includes a circuit for generating a coincidence indicating signal indicating the determination result of coincidence/non-coincidence between an external address and a programmed defective address.

The semiconductor memory device according to the present invention further includes: a word line selection circuit for selecting a corresponding word line from the plurality of normal word lines and a spare word line in accordance with the external address and the coincidence indicating signal; and an address conversion circuit for changing the correspondence relation between the external address and the plurality of spare word lines.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
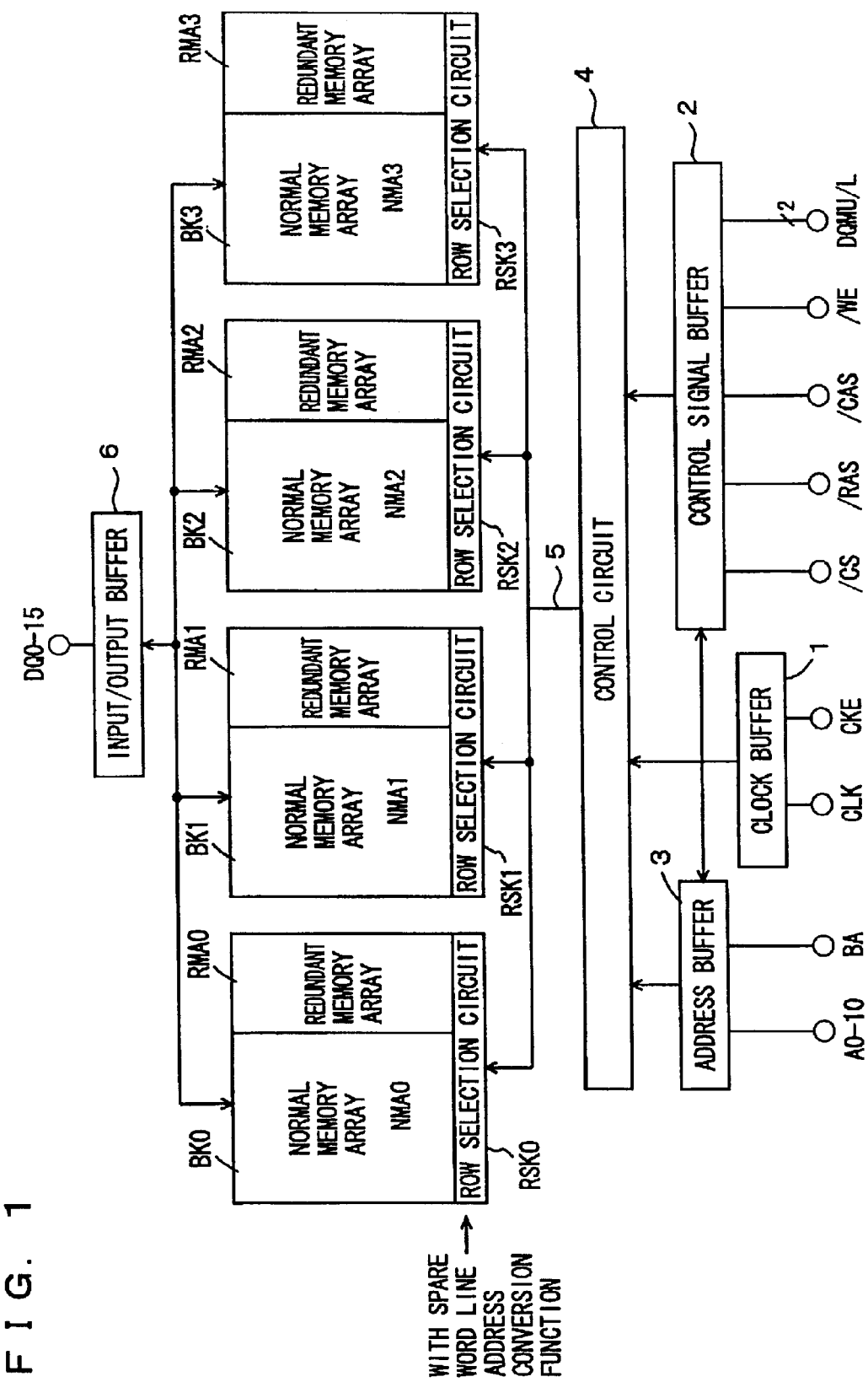
FIG. 1 is a schematic diagram showing an entire construction of a semiconductor memory device according to a first embodiment of the present invention.

FIG. 1 is a schematic diagram showing the entire configuration of the semiconductor memory device according to the first embodiment of the present invention. In FIG. 1, the semiconductor memory device includes four banks BK0 to BK3, which can have the internal memory cell rows driven to the selected state independently from each other. Banks BK0 to BK3, respectively, include normal memory arrays NMA0 to NMA3 having normal memory cells arranged in rows and columns; redundant memory arrays RMA0 to RMA3 for repairing defective memory cell rows in normal memory arrays NMA0 to NMA3; and row selection circuits RSK0 to RSK3 for selecting word lines corresponding to the addressed rows in normal memory arrays NMA0 to NMA3 and redundant memory arrays RMA0 to RMA3.

Row selection circuits RSK0 to RSK3 include normal row selection circuits provided corresponding to the respective normal memory arrays NMA0 to NMA3, and spare row selection circuits provided corresponding to the respective redundant memory arrays RMA0 to RMA3. Redundant memory arrays RMA0 to RMA3 have redundant (spare) memory cells arranged in plural rows, and spare word lines are arranged corresponding to these plural redundant memory cell rows, respectively. Row selection circuits RSK0 to RSK3 have the function of converting the addresses of redundant rows (spare word lines) of redundant memory arrays RMA0 to RMA3 in the test operation mode.

Specifically, when a spare word line is selected in the test operation of operation, the spare word line is selected according to an external address. The correspondence relation between the external address and the spare word line is changed in the test so as to read out data different in logical level to the bit lines in the case when a multi-selection occurs upon selection of the spare word line.

The semiconductor memory device further includes a clock buffer 1 which receives an external clock signal CLK and a clock enable signal CKE determining the enabling and disabling of internal clock signal; an address buffer 3 which receives external address bits A0 to A10 (A0 to 10) and a bank address signal BA to generate an internal address signal in synchronization with the internal clock signal from clock buffer 1; a control signal buffer 2 which receives external control signals /CS, /RAS, /CAS, /WE, and DQMU/L to generate an internal control signal in synchronization with the internal clock signal from clock buffer 1; a control circuit 4 which transmits the internal control signal to the selected bank via an internal bus 5 in accordance with the signals from address buffer 3 and control signal buffer 2, and also transmits the internal address signal from address buffer 3 to banks BK0 to BK3 via internal bus 5; and an input/output buffer 6 which communicates data with a selected bank of these banks BK0 to BK3.

This semiconductor memory device is a synchronous semiconductor memory device operating in synchronization with clock signal CLK, and its internal operation is determined according to the states of control signals /CS, /RAS, /CAS, /WE, and DQMU/L at the edge of clock signal CLK.

Signal DQMU/L is a data mask instruction signal instructing the masking the writing of upper byte data and lower byte data, and includes an upper byte data mask signal DQMU and a lower byte mask instruction signal DQML.

The internal address signal generated by address buffer 3 may be predecoded by a predecoder provided inside control circuit 4 to be applied to banks BK0 to BK3. Alternatively, the internal address signal from address buffer 3 may be transmitted to banks BK0 to BK3 under the control of control circuit 5 to be predecoded and decoded thereat.

Figure 2:
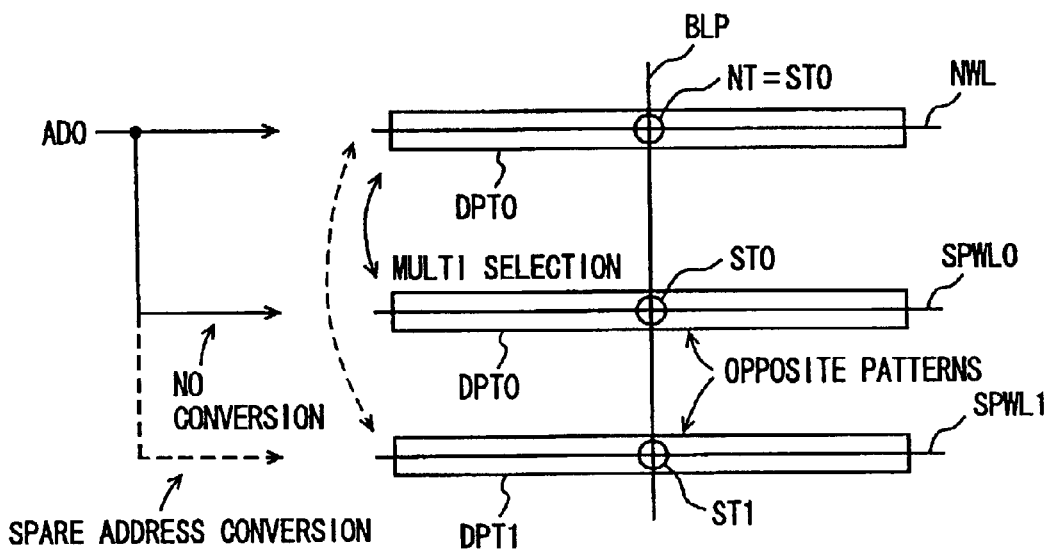
FIG. 2 is a schematic diagram illustrating a way of a spare address conversion in row selection circuits shown in FIG. 1.

FIG. 2 is a schematic diagram depicting the principle of the method of detecting a multi-selection of word lines in the first embodiment of the present invention. In FIG. 2, normal word line NWL is a defective word line, and is replaced by a spare word line SPWL0. Another spare word line SPWL1 is used to repair another defective normal word line through replacement. Now, the case is considered in which the word line multi-selection occurs due to a fuse program failure. In this case, spare word line SPWL0 and defective normal word line NWL are selected concurrently. Therefore, if there is caused a multi-selection of spare word line SPWL0 and normal word line NWL, the same data pattern DPT0 is written for both of spare word line SPWL0 and normal word line NWL in accordance with an address signal AD0.

On the other hand, spare word line SPWL1 is assigned another address, and a data pattern DPT1 opposite in pattern to data pattern DPT0 is stored for spare word line SPWL1. In other words, as for a bit line pair BLP, for normal word line NWL and spare word line SPWL0, data NT (=ST0) and ST0 of the same logical level are stored, respectively. On the other hand, for spare word line SPWL1, data ST1 is stored whose logical level is opposite to data NT and ST0.

After the data writing, address conversion is performed to designate a row address. The address conversion is applied only for the spare word lines. When a defective address is designated and spare word line SPWL0 is to be selected, spare word line SPWL1 is selected in place of spare word line SPWL0. In this state, because of the occurrence of a multi-selection, normal word line NWL is also selected. In this case, data NT and ST1 are read onto bit line pair BLP. Since data NT and ST1 have opposite logical levels from each other, bit line pair BLP has data collision caused, and indefinite data is read out by a sense amplifier.

The data read from this sense amplifier is different from the expected value. Reading indefinite data due to data collision occurs in all the normal memory cells except a defective memory cell on normal word line NWL. While maintaining the conditions that opposite data patterns are always written to spare word lines SPWL0 and SPWL1, and that the same data pattern is always written to spare word line SPWL0 and normal word line NWL, tests are performed using various data patterns. When there is a multi-selection occurring all the time, the address RA assigned to spare word line SPWL0 becomes defective in all data patterns, and therefore it can be determined that multi-selection occurs.

Also, when a multi-selection occurs intermittently, defects can be detected for some data patterns, and therefore, the presence of an intermittent multi-selection can be detected without fail.

The conversion of the correspondence between the external address and the spare word line address upon addressing a spare word line, can be implemented by the switching of the correspondence relation between the defective address program circuit and the spare word lines in the case when the word lines are formed in a non-hierarchical configuration. At the time of writing data to a defective normal word line, the output signal of the defective address program circuit is forcibly kept in the inactive state so as to select the defective normal word line. At the time of writing data to the spare word line, data are written to the spare word line according to the external address, without performing address conversion (switching of the outputs of the defective address program circuit). At the time of reading data out, an address conversion is performed.

Specifically, in the case of the normal non-hierarchical word line configuration, fuse program circuits for storing defective addresses are provided for spare word line SPWL0 and SPWL1, respectively. Therefore, as an address conversion upon detecting a multi-selection, the transmission routes of the output signals of the defective address program circuits are switched so that spare word line SPWL1 is selected when spare word line SPWL0 is designated, and that spare word line SPWL0 is selected when spare word line SPWL1 is designated. In this case, it is required to store an opposite data pattern for the defective normal word line. Since memory cell failure is likely to occur at a concentrated area in the memory array due to a particle or the like in general, it is highly possible that adjacent word lines fall into the defective state concurrently. Therefore, generating test patterns so as to store different data patterns for even row addresses and for odd row addresses can achieve the storage of data patterns different between spare word lines SPWL0 and SPWL1.

In the case of the hierarchical word line configuration composed of main word lines and sub word lines, defective memory cell rows are repaired on a main word line basis as described below, so that the addresses to the sub word lines are converted upon detecting a multi-selection.

Where a single spare word line is provided in the word line non-hierarchical configuration, data are written to the even addresses and the odd addresses such that a checkerboard-like data pattern is formed. In detecting a multi-selection, an address conversion between the even addresses and the odd addresses is applied to the normal word lines. As a result, in selecting the spare word line, data having a different pattern from the data pattern stored in the spare word line are read from the memory cells of the normal word line, and a multi-selection can be detected.

As described above, according to the first embodiment of the present invention, an address assigned to a spare word line is converted in detecting a multi-selection, and a reverse data pattern is written to the spare word line, and a multi-selection can be reliably detected with ease.

Address conversion is performed at the time of writing data, and does not need to be applied at the time of reading data. The correspondence relation between the spare word lines and the addresses has only to be different between data writing and data reading.

[Second Embodiment]

Figure 3:
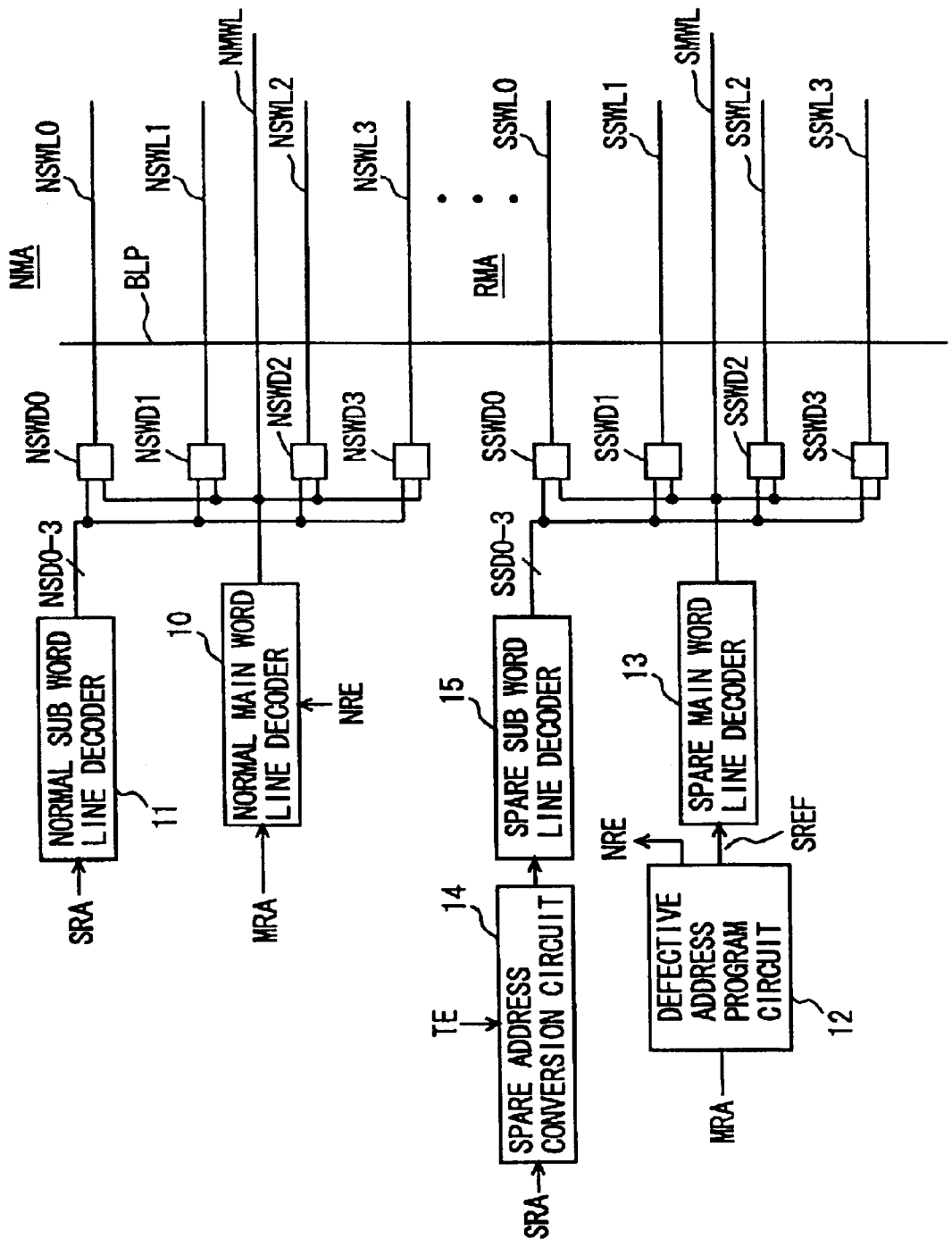
FIG. 3 is a schematic diagram showing a configuration of a main part of a semiconductor memory device according to a second embodiment of the present invention.

FIG. 3 is a schematic diagram showing the configuration of a main part of the semiconductor memory device according to the second embodiment of the present invention. In FIG. 3, the configuration of the memory array in one bank is shown schematically. In FIG. 3, a normal memory array NMA includes a main word line and sub word lines. One normal main word line NMWL and four normal sub word lines NSWL0 to NSWL3 arranged corresponding to normal main word line NMWL are representatively shown.

Normal sub word drivers NSWD0 to NSWD3 are disposed corresponding to normal sub word lines NSWL0 to NSWL3, respectively. These normal sub word drivers NSWD0 to NSWD3 drive normal sub word lines NSWL0 to NSWL3 to the selected state in accordance with the signal on normal main word line NMWL and sub decode signals NSD0 to NSD3 (NSD0–3) from a normal sub word line decoder 11, respectively. Normal sub word line decoder 11 decodes a sub word line address SRA to generate normal sub decode signals NSD0 to NSD3.

Normal main word line NMWL is driven to the selected state in accordance with the output signal of a normal main word line decoder 10 which in turn decodes a main word line address MRA to generate a normal main word line selection signal. Normal main word line decoder 10 performs a decoding operation when a normal row enable signal NRE is in the active state, and has the decoding operation inhibited when normal row enable signal NRE is in the inactive state, to hold normal main word line NMWL in the non-selected state.

A redundant memory array RMA has spare memory cells arranged in rows and columns. A redundant memory array RNA has spare word lines arranged in the hierarchic word line configuration. Specifically, there are arranged a spare main word line SMWL and four spare sub word lines SSWL0 to SSWL3 arranged corresponding to spare main word line SMWL. Spare sub word drivers SSWD0 to SSWD3 are disposed corresponding to spare sub word lines SSWL0 to SSWL3, respectively.

Spare main word line SMWL is provided with a defective address program circuit 12 storing the address of a defective normal main word line to be replaced by spare main word line SMWL, and a spare main word line decoder 13 for driving spare main word line SMWL to the selected state in accordance with a spare row enable fast signal SREF from defective address program circuit 12. Defective address program circuit 12 further generates normal row enable signal NRE to main word line decoder 10, in accordance with the main word line address and the stored defective address.

Spare main word line decoder 13 is equivalently a drive circuit, and in response to activation of spare row enable fast signal SREF from defective address program circuit 12, drives the corresponding spare main word line SMWL to the selected state.

Spare sub word lines SSWL0 to SSWL3 are provided with a spare address conversion circuit 14 for converting sub word line address SRA in accordance with a test mode instruction signal TE, and a spare sub word line decoder 15 for generating spare sub decode signals SSD0 to SSD3 in accordance with a converted spare address from spare address conversion circuit 14. In selecting spare main word line SMWL, either one of spare sub word drivers SSWD0 to SSED3 is selected in accordance with spare sub decode signals SSD0 to SSD3 from spare sub word line decoder 15, and the corresponding spare sub word line SSWL (either one of SSWL1 to SSWL3) is driven to the selected state.

Spare sub word line decoder 15 is not conventionally provided, and sub decode signals from normal sub word line decoder 11 are applied commonly to the normal sub word lines and the spare sub word lines. Therefore, when the main word line is replaced, normal sub word lines NSWL0 to NSWL3 are replaced by spare sub word lines SSWL0 to SSWL3, respectively. Normal sub word lines NSWL0 to NSWL3 are assigned the same addresses as spare sub word lines SSWL0 to SSWL3, respectively.

A bit line pair BLP is arranged in the direction crossing main word lines NWL and SMWL. On bit line pair BLP, memory cells are arranged in a predetermined pattern along the column direction.

Figure 4:
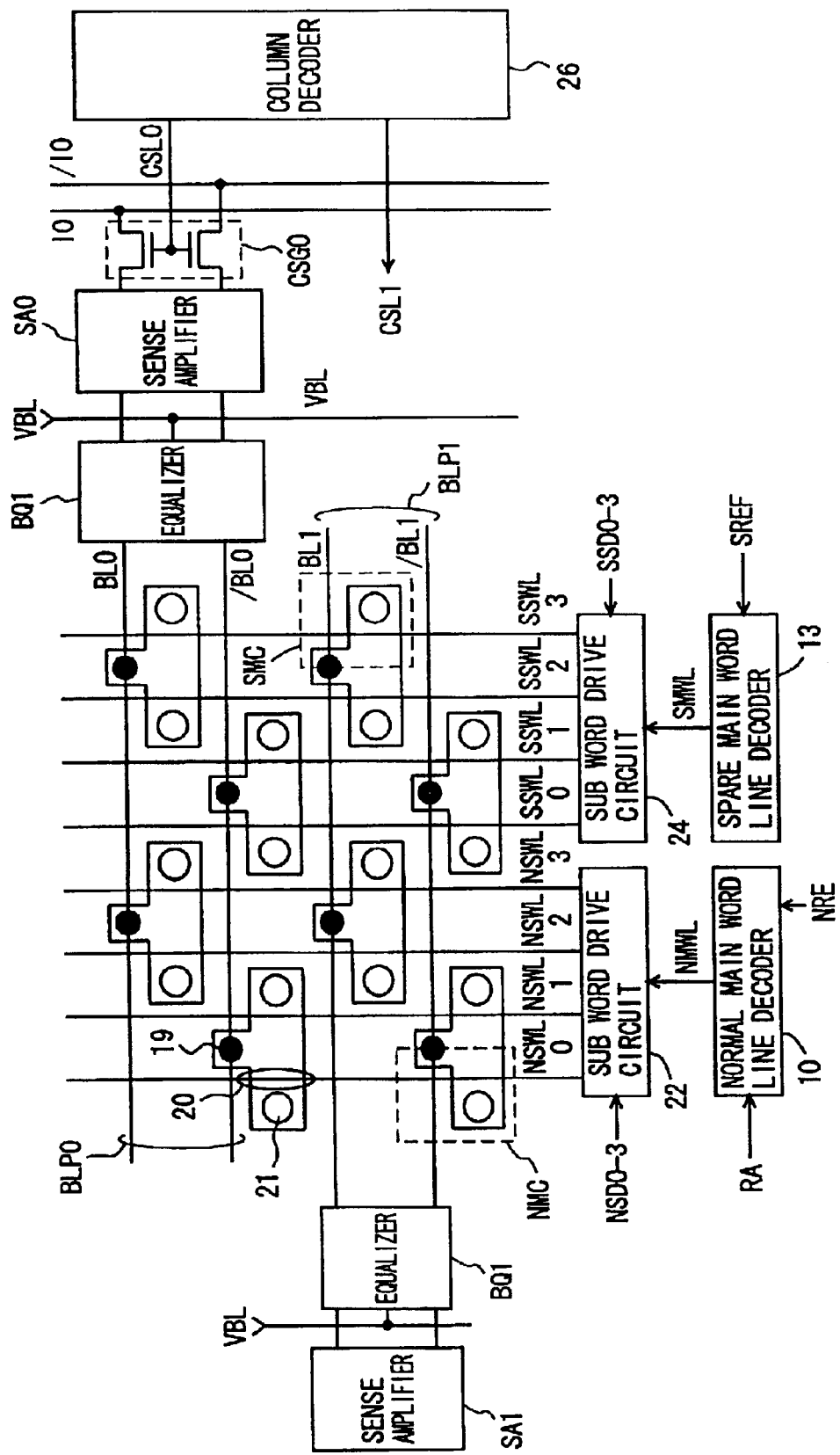
FIG. 4 is a schematic diagram showing a configuration of an array section in the semiconductor memory device according to the second embodiment of the present invention.

FIG. 4 is a schematic diagram showing the arrangement of memory cells in the normal memory array and the redundant memory array. In FIG. 4, memory cells are arranged in rows and columns with 2-bit memory cells being a unit. In the normal memory array and the redundant memory array, the memory cells are arranged with the same pattern repeated successively. In FIG. 4, the memory cells are arranged by repeating the same pattern with four rows being a unit in the column direction, and are arranged in alternate columns in the row direction.

Of the memory cells arranged by repeating the same pattern successively, the memory cells used to repair a defective memory cell are used for spare memory cells SMC, and the other memory cells are used as normal memory cells NMC to be accessed in accordance with an address signal. Therefore, these normal memory cells NMC and spare memory cells SMC are repeatedly arranged in the same pattern within the same array region, and have the same configuration.

Bit line pairs BLP0 and BLP1 are arranged corresponding to memory cell columns. Bit line pair BLP0 includes bit lines BL0 and /BL0, and bit line pair BLP1 includes bit lines BL1 and /BL1.

Sub word lines are arranged corresponding to the respective memory cell rows. FIG. 4 shows normal sub word lines NSWL0 to NSWL3 and spare sub word lines SSWL0 to SSWL3. Normal sub word lines NSWL0 to NSWL3 are arranged corresponding to normal main word line NMWL, and spare sub word lines SSWL0 to SSWL3 are arranged corresponding to spare main word line SMWL.

Each of memory cells SMC and NMC includes a bit line contact 19 connected to a corresponding bit line, a memory transistor 20 formed corresponding to an intersection with the corresponding sub word line, and a memory cell contact 21 connected to a capacitor for storing data. In other words, spare memory cells SMC and normal memory cells NMC have the memory cell construction of one transistor-one capacitor type. Bit line contacts 19 are formed alternately every two sub word lines in the column direction on bit lines BL and /BL. As to each bit line BL or /BL, bit line contacts 19 are arranged every four sub word lines. In the row direction, adjacent bit line contacts 19 are formed with one bit line disposed in between. Thus, memory cells are arranged corresponding to the crossings of one of the bit line pairs and the sub word lines.

In this arrangement of memory cells, normal sub word lines NSWL0, NSWL1 and spare sub word lines SSWL0, SSWL1 are the same in arranged memory cell pattern. Similarly, normal sub word lines NSWL2, NSWL3 and spare sub word lines SSWL2, SSWL3 are the same in arranged memory cell pattern.

Bit line pair BLP0 is provided with an equalizer BQ1 which precharges and equalizes bit lines BL0, /BL0 to an intermediate voltage VBL when activated; a sense amplifier SA0 which senses and amplifies data read onto bit lines BL0, /BL0 when activated; and a column selection gate CSD0 which connects sense amplifier SA0 to internal data lines IO, /IO in accordance with a column selection signal CS0 from a column decoder 26.

Similarly, bit line pair BLP1 is provided with an equalizer BQ1 which precharges and equalizes bit lines BL1, /BL1 to intermediate voltage VBL when activated, and a sense amplifier SA1 which senses and amplifies the potential difference between bit lines BL1 and /BL1 when activated. Although it is not clearly shown in FIG. 4, a column selection gate is provided adjacent to sense amplifier SA1, and sense amplifier SA1 is coupled with another internal data lines in accordance with the column selection signal CSL1 from column decoder 26.

A sub word drive circuit 22 is provided to normal sub word lines NSWL0 to NSWL3, and a sub word drive circuit 24 is provided to spare sub word lines SSWL0 to SSWL3. Sub word drive circuit 22 includes normal sub word drivers NSWD0 to NSWD3 shown in FIG. 3, and sub word drive circuit 24 includes spare sub word drivers SSWD0 to SSWD3 shown in FIG. 3.

Figure 5:
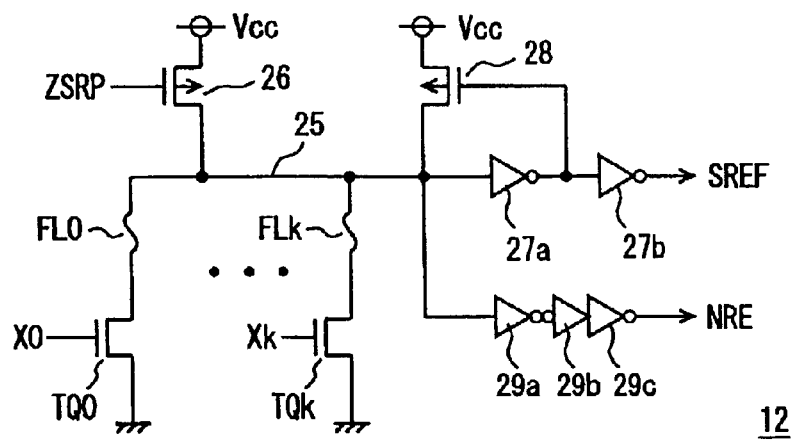
FIG. 5 is a diagram showing an example of a configuration of a defective address program circuit shown in FIG. 3.

FIG. 5 is a diagram showing an example of a construction of defective address program circuit 12 shown in FIG. 3. The defective address program circuit 12 includes N-channel MOS transistors TQ0 to TQk which receive predecoded signals X0 to Xk at their respective gates; fuse elements FL0 to FLk which are connected in series between a determination node 25 and the respective MOS transistors TQ0 to TQk; s P-channel MOS transistor 26 rendered conductive upon activation of a precharge instruction signal ZSRP, and transmitting a power supply voltage Vcc to determination node 25 when rendered conductive; an inverter 27a which inverts the signal on determination node 25; an inverter 27b which inverts the output signal of inverter 27a, to generate a spare row enable fast signal SREF; a P-channel MOS transistor 28 rendered conductive selectively in accordance with the output signal of inverter 27a, and transmitting a power supply voltage Vcc to determination node 25 when rendered conductive; and three-stage cascaded inverters 29a to 29c which inverts the signal on determination node 25. Inverter 29c outputs a normal row enable signal NRE.

The sources of MOS transistors TQ0 to TQk are connected to the ground node.

In the configuration of defective address program circuit 12 shown in FIG. 5, the fuse element FL corresponding to the predecoded signal which attains H level upon designating a defective address, is blown off. Therefore, when the defective address is designated, the discharge path is cut off, and determination node 25 is kept at the power supply voltage Vcc level precharged by MOS transistor 26, and spare row enable fast signal SREF remain at H level. On the other hand, normal row enable signal NRE from inverter 29c attains L level.

MOS transistor 28 is provided to prevent determination node 25 from being put into the floating state at the time of addressing of a defective address when precharge instruction signal ZSRP attains H level and MOS transistor 26 is rendered non-conductive in the active cycle.

As shown in the configuration of defective address program circuit 12 of FIG. 5, when at least one of fuse elements FL0 to FLk is blown incompletely, the voltage level of determination node 25 is changed to an intermediate voltage level by leakage current. In this case, the output signal of inverter 27a also attains the intermediate voltage level. In the active cycle, even if MOS transistor 26 is in the non-conductive, OFF state, MOS transistor 28 is brought into the conductive state, to supply a current from the power supply node to determination node 25, thereby maintaining the determination at the intermediate voltage level.

When the output signal of inverter 29a is lower than the input logical threshold voltage of inverter 29b, spare row enable fast signal SREF stays at H level. When the output signals of inverters 29a and 29b attains the intermediate voltage level and the output signal of inverter 29b is lower than the input logical threshold voltage of inverter 29c, normal row enable fast signal NRE attains H level. Therefore, spare row enable fast signal SREF and normal row enable signal NRE both attain H level, resulting in selection of both of a normal row and a spare row.

When the voltage level of determination node 25 is gradually decreased by leakage current, and spare row enable signal SREF falls to L level and normal row enable signal NRE rises to H level after the start of an active cycle, the spare main word line and the normal main word line are both driven to the selected state, to cause a multi-selection of the word lines.

Defective address program circuit 12 may receive complementary internal row address bits RA and /RA in place of predecoded signals X0 to Xk.

Figure 6:
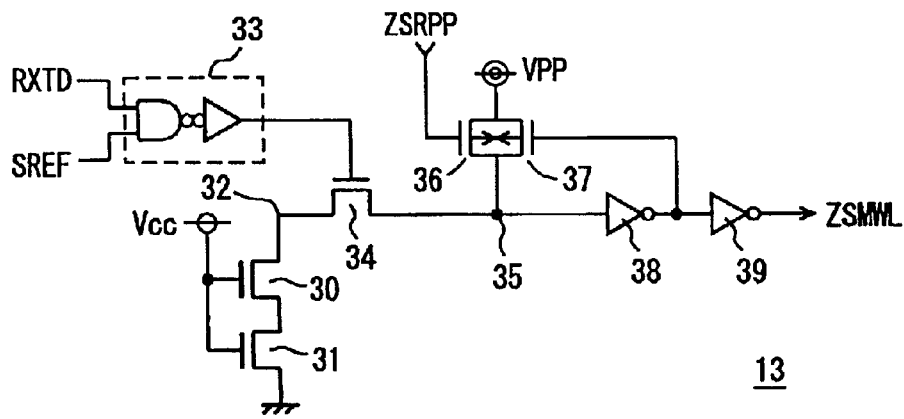
FIG. 6 is a diagram showing an example of a configuration of a spare main word line decoder shown in FIG. 3.

FIG. 6 is a diagram showing an example of a construction of spare main word line decoder 13 shown in FIG. 4. In FIG. 6, spare main word line decoder 13 includes an AND circuit 33 which receives an active cycle instruction signal RXTD and spare row enable fast signal SREF; N-channel MOS transistors 30, 31 which are connected in series between a node 32 and a ground node, and receive power supply voltage Vcc at the respective gates; an N-channel MOS transistor 34 which electrically connects node 32 to a node 35 in accordance with the output signal of AND circuit 33; a P-channel MOS transistor 36 which transmits a high voltage VPP to node 35 in accordance with a precharge instruction signal ZSRPP; an inverter 38 which inverts the signal on node 35; an inverter 39 which inverts the output signal of inverter 38 and outputs a spare main word line selection signal ZSMWL; and a P-channel MOS transistor 37 which is rendered conductive when the output signal of inverter 38 is at L level, and transmits the high voltage VPP to node 35 when rendered conductive.

Precharge instruction signal ZSRPP is a signal having an amplitude of the high voltage VPP level, and changes in the same manner as precharge instruction signal ZSRP.

Inverters 38 and 39 receive high voltage VPP as their operating power supply voltage. Spare main word line selection signal ZSMWL is set at L level when selected and at the high voltage VPP level when not selected. This is because it is necessary to transmit high voltage VPP to a selected sub word line.

In the configuration of spare main word line decoder 13 shown in FIG. 6, node 32 is held at a ground voltage level because MOS transistors 30, 31 are in a conductive, ON state all the time. In the precharge cycle, precharge instruction signal ZSRP is at L level, node 35 is precharged at the high voltage VPP level by MOS transistor 36, and spare main word line selection signal ZSMWL maintains the high voltage VPP level.

In the precharge cycle, active cycle instruction signal RXTD is at L level, the output signal of AND circuit 33 is at L level, and MOS transistor 34 is in an OFF state. The output signal of inverter 38 is at L level and MOS transistor 37 enters the ON state.

When the active cycle begins, precharge instruction signal ZSRPP attains H level of high voltage VPP level, and MOS transistor 36 turns OFF. Active cycle instruction signal RXTD attains H level. When a defective address is designated, spare row enable fast signal SREF is at H level, the output signal of AND circuit 33 attains H level, and MOS transistor 34 turns ON. Consequently, node 35 is discharged to the ground node via MOS transistors 34, 30, and 31, and responsively, the output signal of inverter 38 rises to the high voltage VPP level, and MOS transistor 37 turns OFF. Spare main word line selection signal ZSMWL from inverter 39 attains L level at the ground voltage level, and spare main word line SMWL is driven to the selected state.

When an address other than the defective address is designated, spare row enable signal SREF is at L level, the output signal of AND circuit 33 is at L level, and MOS transistor 34 remains OFF, and spare main word line decoder 13 remains in the same state as in the precharge cycle.

As shown in FIG. 6, when the output signal of AND circuit 33 is at L level, MOS transistor 34 is kept in the OFF state. As a result, when spare row enable fast signal SREF is at H level at the beginning of the active cycle, and spare row enable fast signal SREF falls to L level by leakage current after node 35 is discharged to L level, MOS transistor 34 remains OFF, node 35 is put in the floating state at L level, and spare main word line selection signal ZSMWL remains at L level in the selected state. In this state, when normal row enable signal NRE attains H level, normal main word line selection signal is activated to cause a multi-selection.

Figure 7:
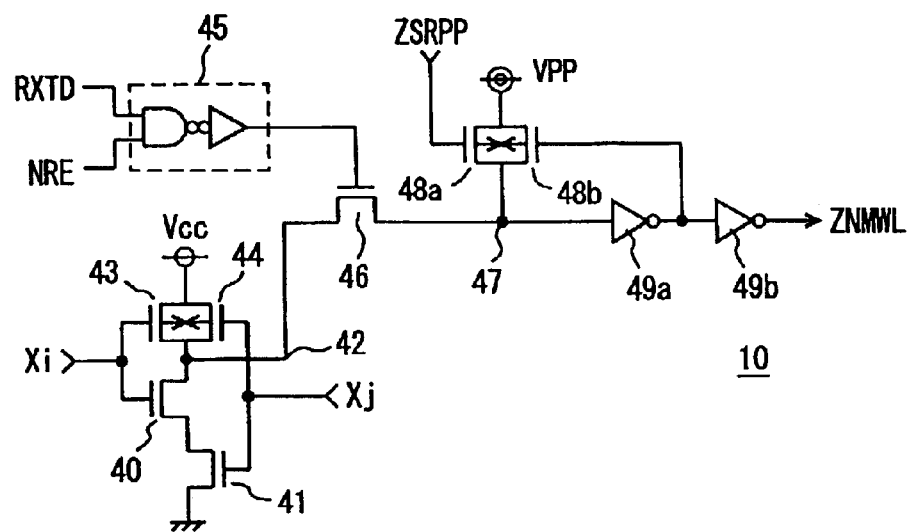
FIG. 7 is a diagram showing an example of a configuration of a normal main word line decoder shown in FIG. 3.

FIG. 7 is a diagram showing an example of a construction of normal main word line decoder 10 shown in FIG. 3. In FIG. 7, normal main word line decoder 10 includes N-channel MOS transistors 40 and 41 which are connected in series between node 42 and a ground node, and receive predecoded signals Xi and Xj at the respective gates; a P-channel MOS transistor 43 which is connected between a power supply node and a node 42, and receives predecoded signal Xi at a gate thereof; a P-channel MOS transistor 44 which is connected between node 42 and the power supply node, and receives predecoded signal Xj at a gate thereof; an AND circuit 45 which receives an active cycle instruction signal RXTD and normal row enable signal NRE; an N-channel MOS transistor 46 which is rendered conductive when the output signal of AND circuit 45 is at H level and electrically connects node 42 to a node 47 when rendered conductive; a P-channel MOS transistor 48$a$ which is rendered conductive when precharge cycle instruction signal ZSRPP is at L level, and transmits the high voltage VPP to node 47 when rendered conductive; an inverter 49$a$ which inverts the signal on node 47; an inverter 49$b$ which inverts the output signal of inverter 49$a$, and generates the main word line selection signal ZNMWL; and a P-channel MOS transistor 48$b$ which is rendered conductive when the output signal of the inverter 49$a$ is at L level and transmits high voltage VPP to node 47 when rendered conductive.

Normal main word line selection signal ZMWL is at L level when selected, and attains the high voltage VPP level when not selected. Consequently, inverters 49$a$ and 49$b$ receive the high voltage VPP as an operating power supply voltage.

According to the configuration of main word line decoder 10 shown in FIG. 7, in the precharge cycle, the output of AND circuit 45 is at L level, and MOS transistor 46 is in an OFF state. On the other hand, MOS transistor 48$a$ turns ON in accordance with precharge instruction signal ZSRPP, and node 47 is precharged to the high voltage VPP level. Consequently, the output signal of inverter 49$a$ attains L level, and MOS transistor 48$b$ turns ON.

When the active cycle starts, precharge instruction signal ZSRPP attains the high voltage VPP level, and MOS transistor 48$a$ turns OFF. Active cycle instruction signal RXTD attains H level, and when normal row enable signal NRE is at H level, the output signal of AND circuit 45 attains H level and MOS transistor 46 turns ON. When predecoded signals Xi and Xj are both at H level, MOS transistors 43 and 44 become OFF, and MOS transistors 40 and 41 become ON, which drives node 42 to the ground voltage level. Consequently, node 47 attains L level, and normal main word line selection signal ZNMWL attains L level.

On the other hand, when at least one of predecoded signals Xi and Xj is at L level, at least one of MOS transistors 40 and 41 remains OFF, and at least one of MOS transistors 43 and 44 remains ON. Hence, node 42 attains the power supply voltage Vcc level. MOS transistor 46 has the gate and source both at the power supply voltage Vcc level and turns OFF and functions as a decoupling transistor for electrically isolating node 42 from node 47. Consequently, node 47 is held at the high voltage VPP level, and normal main word line selection signal ZNMWL is maintained at the high voltage VPP level.

In the active cycle, when normal row enable signal NRE is at L level, the output signal of AND circuit 45 is at L level, MOS transistor 46 turns OFF, and normal main word line ZNMWL is held at the high voltage VPP level as in the precharge cycle.

In the active cycle, the predecoder signal is latched by a not-shown circuit, and when normal row enable signal NRE rises from the L level to the H level, MOS transistor 46 turns ON, node 47 is discharged to the ground voltage level in accordance with predecoder signals Xi and Xj, and normal word line selection signal ZMWL is driven to L level.

When normal main word line selection signal ZMWL is driven to the selected state after the activation of the sense amplifier, the bit line potential is made definite in accordance with the data of a memory cell connected to the spare sub word line. Therefore, an adverse effect of the defective bit data on the read out data can be suppressed, but there is caused a problem of increased current consumption. When normal main word line selection signal ZMWL is driven to the selected state before the activation of the sense amplifier, the data of the defective memory cell exerts a detrimental effect on the data of the memory cell connected to the spare sub word line, and data can not be read out correctly. Such a multi-selection is detected by the configuration which will be detailed in the following.

Figure 8:
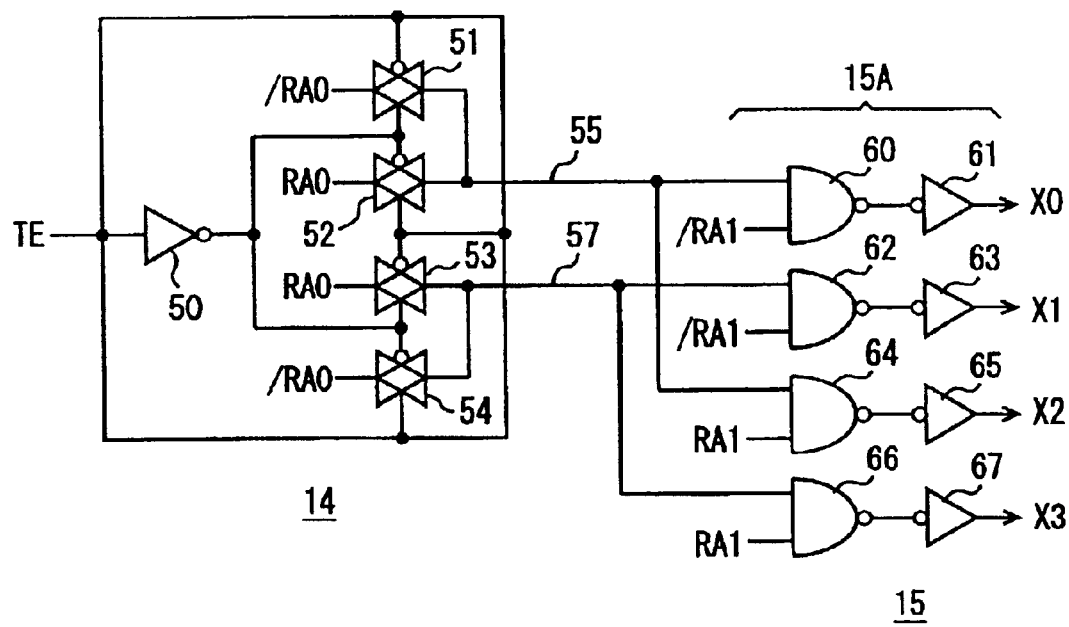
FIG. 8 is a diagram showing, by way of example, a configuration of a spare address conversion circuit and a spare sub word line decoder shown in FIG. 3.

FIG. 8 is a diagram showing an example of a construction of spare address conversion circuit 14 shown in FIG. 3. FIG. 8 also shows the configuration of predecode circuit 15A in spare sub word line decoder 15.

In FIG. 8, spare address conversion circuit 14 includes an inverter 50 which receives a test mode instruction signal TE; a CMOS transmission gate 51 which transmits a complementary row address bit /RA0 to a node 55 in accordance with test mode instruction signal TE and the output signal of inverter 50; a CMOS transmission gate 52 which is rendered conductive complementarily to CMOS transmission gate 51 in accordance with test mode instruction signal TE and the output signal of inverter 50 and transmits a row address bit RA0 to a node 55 when rendered conductive; a CMOS transmission gate 53 which is selectively rendered conductive in accordance with test mode instruction signal TE and the output signal of inverter 50, and transmits the row address bit RA0 to a node 57 when rendered conductive; and a CMOS transmission gate 54 which is rendered conductive complementarily to CMOS transmission gate 53 in accordance with test mode instruction signal TE and the output signal of inverter 50, and transmits the complementary row address bit /RA0 to node 57 when rendered conductive. Address bits RA0 and /RA0 are generated from address buffer 3 shown in FIG. 1.

Row address bit RA0 determines the address to be odd or even. When test mode instruction signal TE is at H level, COMS transmission gates 52 and 54 are rendered conductive, and transmit address bits RA0 and /RA0 to nodes 55 and 57, respectively. On the other hand, when test mode instruction signal TE is at L level, COMS transmission gates 51 and 53 are rendered conductive and transmit address bits /RA0 and RA0 to nodes 55 and 57, respectively.

In this manner, changing the logical level of test mode instruction signal TE exchanges the nodes to which the complementary address bits RA0 and /RA0 are transmitted, respectively. The switching in position of row address bits RA0 and /RA0 inverts the logical level of address bit RA0 equivalently. In other words, the exchange in position of row address bits RA0 and /RA0 allows the exchange of an even address to an odd address and vice versa.

A predecode circuit section 15A of spare sub word line decoder 15 includes a NAND circuit 60 which receives the bit on node 55 and an address bit /RA1; an inverter 61 which inverts the output signal of NAND circuit 60, and generates a predecoded signal X0; a NAND circuit 62 which receives the bit on node 57 and address bit /RA1; an inverter 63 which receives the output signal of NAND circuit 62, and generates a predecoded signal X1; a NAND circuit 64 which receives row address bits /RA0 and RA1; an inverter 65 which inverts the output signal of NAND circuit 64, and generates a predecoded signal X2; a NAND circuit 66 which receives row address bits /RA0 and RA1; and an inverter 67 which inverts the output signal of NAND circuit 66, and generates a predecoded signal X3. These predecoded signals X0 to X3 designate spare sub word lines SSWL0 to SSWL3, respectively.

Predecode circuit section 15A shown in FIG. 8 is an AND type predecode circuit, and each of NAND circuits 60, 62, 64, and 66 outputs an L level signal when received row address bits are both at H level.

Figure 9:
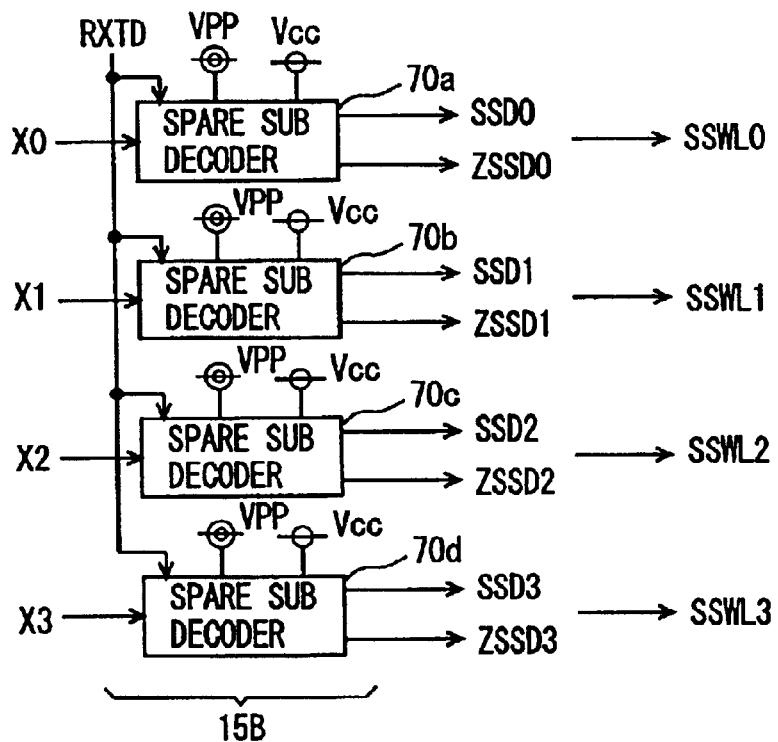
FIG. 9 is a diagram showing, by way of example, a configuration of a decode section of a spare word line decoder shown in FIG. 3.

FIG. 9 is a schematic diagram showing the configuration of the decode unit of spare sub word line decoder 15. In FIG. 9 a decode unit 15B of spare word line decoder 15 includes a spare sub decoder 70a which generates complementary sub decode signals SD0 and ZSD0 in accordance with predecoded signal X0 and active cycle instruction signal RXTD; a spare sub decoder 70b which generates spare sub decode signals SSD1 and ZSSD1 in accordance with predecoded signal X1 and active cycle instruction signal RXTD; a spare sub decoder 70c which generates spare sub decode signals SSD2 and ZSSD2 in accordance with predecoded signal X2 and active cycle instruction signal RXTD; and a spare sub decoder 70d which generates spare sub decode signals SSD3 and ZSSD3 in accordance with predecoded signal X3 and active cycle instruction signal RXTD.

Spare sub decode signals SSD0 to SSD3 have an amplitude of a high voltage VPP level, while complementary spare sub decode signals ZSSD0 to ZSSD3 have an amplitude of a power supply voltage Vcc level. Spare sub decode signals SSD0 to SSD3 are at the high voltage VPP level when selected, and at the ground voltage level when not selected. On the other hand, complementary sub decode signals ZSSD0 to ZSSD3 are at the ground voltage level when the corresponding sub word lines are in the selected state, and at the power supply voltage Vcc level when the corresponding sub word lines are in the non-selected state.

Normal sub word line decoder 11 has the same configuration as predecode circuit 15A and decode circuit 15B shown in FIGS. 8 and 9, respectively, and generates normal sub word line decode signals in accordance with address bits RA0 and RA1 received from the address buffer. Address conversion operation is not performed for normal sub word line decoder 11.

Figures 10, 11, 12:
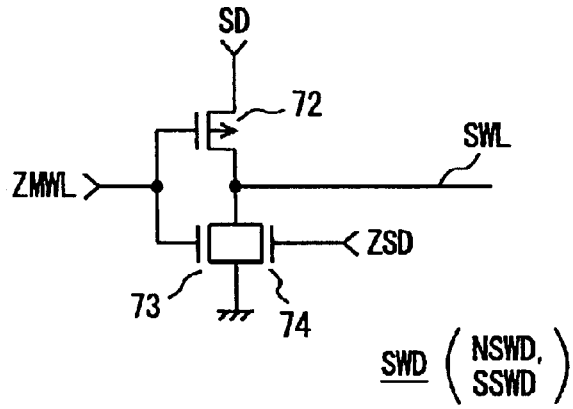
FIG. 10 is a diagram showing an example of a configuration of sub word drivers shown in FIG. 3.
FIG. 11 is a diagram showing the correspondence relationship between spare word lines and row addresses in a normal operation mode according to the second embodiment of the present invention.
FIG. 12 is a diagram showing the correspondence relationship between spare sub word lines and row address bits in a test mode according to the second embodiment of the present invention.

FIG. 10 shows an example of a construction of a sub word driver SWD. Since a normal sub word driver NSWD and a spare sub word driver SSWD have the same configuration, FIG. 10 shows representatively a sub word driver SWD.

In FIG. 10, sub word driver SWD includes a P-channel MOS transistor 72 which transmits a sub decode signal SD to a sub word line SWL in accordance with main word line selection signal ZMWL; an N-channel MOS transistor 73 which discharges sub word line SWL to the ground voltage level in accordance with main word line selection signal ZMWL; and an N-channel MOS transistor 74 which drives sub word line SWL to the ground voltage level in accordance with a complementary decode signal ZSD.

When main word line selection signal ZMWL is at the high voltage VPP level, MOS transistor 72 is in the OFF state, MOS transistor 73 is in the ON state, and sub word line SWL is kept at the ground voltage level, regardless of the logical levels of sub decode signals SD and ZSD.

On the other hand, when main word line selection signal ZMWL is at L level, MOS transistor 73 turns OFF. When sub decode signal SD is at the high voltage VPP level, sub decode signal SD of the high voltage VPP level is transmitted to sub word line SWL via MOS transistor 72. The complementary sub decode signal ZSD is at the ground voltage level, MOS transistor 74 remains OFF, and sub word line SWL is driven to the high voltage VPP level.

On the other hand, when sub decode signal SD is at the ground voltage level, MOS transistor 72 remains OFF because its gate and source are the same in voltage level. In this state, complementary sub decode signal ZSD is at H level, and sub word line SWL is driven to the ground voltage level via MOS transistor 74.

Therefore, sub word line SWL is driven to either the high voltage VPP level or the ground voltage level in accordance with main word line selection signal ZMWL and sub decodes SD and ZSD.

FIG. 11 shows the correspondence relationship between row address bits RA1, RA0 and spare sub word lines in the case when test mode instruction signal TE is at L level. In FIG. 11, when test mode instruction signal TE1 is at L level, CMOS transmission gates 51 and 53 shown in FIG. 8 turns ON, and row address bits /RA0 and RA0 are transmitted to nodes 55 and 57, respectively. Therefore, when row address bits (RA1, RA0) are (0,0), (0,1), (1,0), and (1,1), predecoded signals X0, X1, X2, and X3 are driven to the selected state, respectively. These predecoded signals X0 to X3 correspond to spare sub word lines SSWL0 to SSWL3, respectively, and sequential increment of the address represented by row address bits RA1 and RA0 allows sequential selection of spare sub word lines SSWL0 to SSWL3.

FIG. 12 is a schematic diagram showing the correspondence relationship between row address bits RA1, RA0 and spare sub word lines in the case when test mode instruction signal TE is at H level. When test mode instruction signal TE is at H level, CMOS transmission gates 52 and 54 shown in FIG. 8 turn ON, and row address bits /RA0 and RA0 are transmitted to nodes 55 and 57, respectively. Therefore, when row addresses are designated by incrementing row address bits (RA1, RA0) one by one from (0,0) up to (1,1), predecoded signals X1, X0, X3, and X2 are driven to the selected state in this order. In other words, even addresses are converted to odd addresses, whereas odd addresses are converted to even addresses. Consequently, spare sub word lines SSWL1, SSWL0, SSWL3, and SSWL2 are selected in this order.

Figure 13:
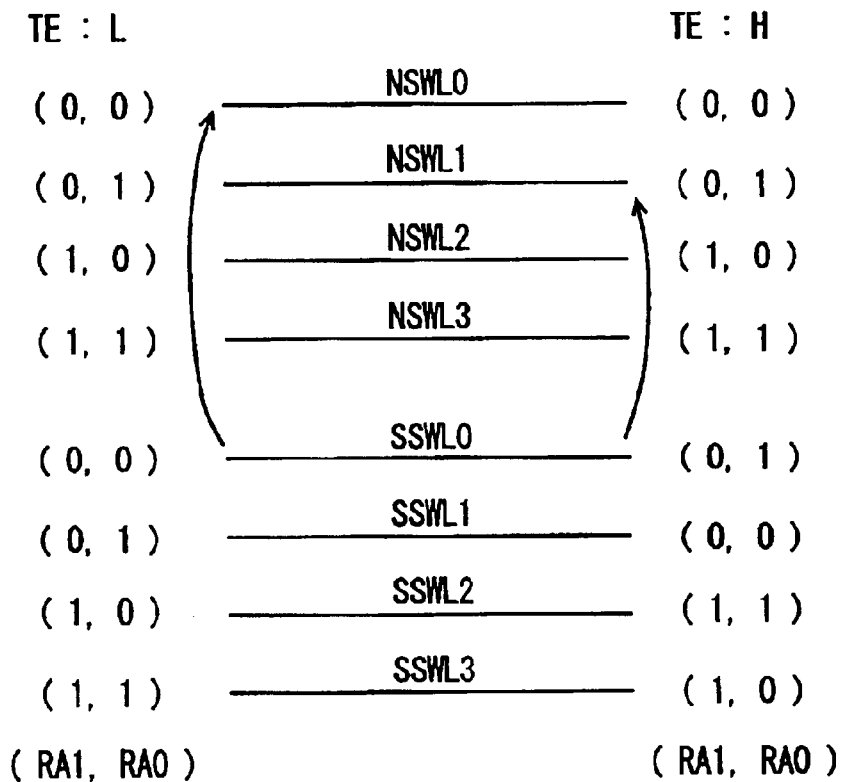
FIG. 13 is a schematic diagram showing the correspondence relationship between sub word lines and normal word lines according to the second embodiment of the present invention.

FIG. 13 shows a schematic diagram showing the correspondence relationship of row address bits between spare sub word lines SSWL0 to SSWL3 and the corresponding normal sub word lines NSWL0 to NSWL3. In FIG. 13, when test mode instruction signal TE is at L level, normal sub word lines NSWL0 to NSWL3 correspond to spare sub word lines SSWL0 to SSWL3, respectively.

On the other hand, when test mode instruction signal TE is set at H level, spare sub word line SSWL0 corresponds to normal sub word line NSWL1, and spare sub word line SSWL1 corresponds to normal sub word line NSWL0. In addition, spare sub word lines SSWL2 and SSWL3 correspond to normal sub word lines NSWL3 and NSWL2, respectively.

When data of a checkerboard pattern are written where data are different in logical level between even row addresses and odd row addresses in the column direction, if a multi-selection occurs, different data patterns are read out on the same bit lines, and the sense amplifiers could not read out the data corresponding to the expected value. A defect can be detected by reading the data amplified and latched by the sense amplifiers externally for comparison with the expected value data pattern.

As shown in FIG. 4, spare word lines SSWL0, SSWL1 and normal sub word lines NSWL0, NSWL1 have the same pattern of arrangement of the connected memory cells. Normal sub word lines NSWL0, NSWL3 and spare sub word lines SSWL2, SSWL3 have the same pattern of arrangement of the connected memory cells. Therefore, as shown in FIG. 14, in the case where data of different logical levels are written to even addresses and to odd addresses, if a multi-selection occurs, data of different logical levels are read on the same bit lines.

Figure 14:
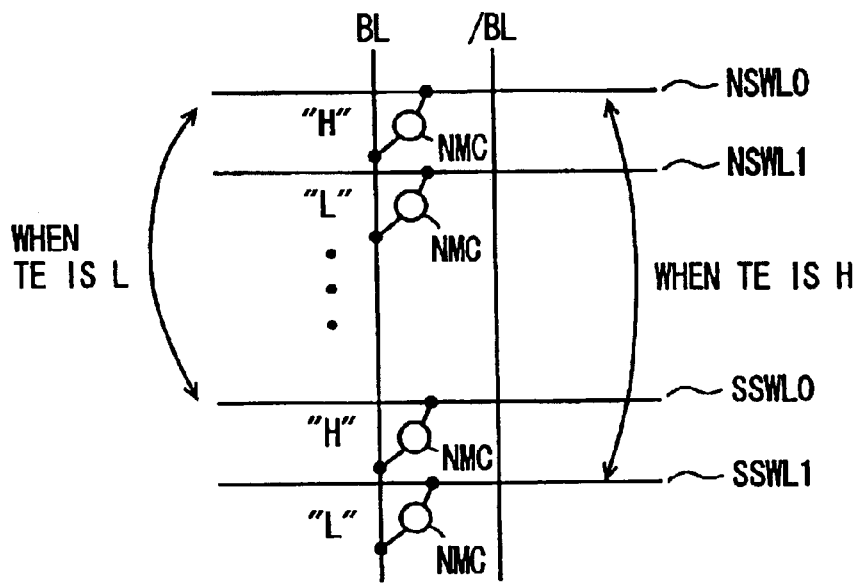
FIG. 14 is a diagram showing an example of write data patterns of normal memory cells and spare memory cells according to the second embodiment of the present invention.

As shown in FIG. 14, it is assumed that normal memory cells NMC are arranged corresponding to the crossings between normal sub word lines NSWL0, NSWL1 and bit line BL, and that spare memory cells SMC are arranged corresponding to the crossings between spare sub word lines SSWL0, SSWL1 and bit line BL.

Data at H level is written into normal memory cell NMC of normal sub word line NSWL0, and data at L level is stored in normal memory cell NMC connected to normal sub word line NSWL1. Similarly, data at H level is stored in memory cell SMC connected to spare sub word line SSWL0, and data at L level is stored in memory cell SMC connected to spare sub word line SSWL1.

When a multi-selection occurs and address conversion is not performed, spare sub word line SSWL0 and normal sub word line NSWL0 are selected at a time, and H level data are read out on bit line BL. When normal memory cell MSC is a non-defective memory cell, the same data as written data are read out on the bit line, and sensed and amplified by the sense amplifier. Therefore, the data to be amplified and latched by the sense amplifier is the same as expected value data, and this multi-selection could not detected externally.

On the other hand, in the case where test mode instruction signal TE is set at H level, spare sub word line SSWL1 and normal sub word line NSWL0 are selected concurrently when a multi-selection occurs. Consequently, data at H level is read from the memory cell connected to normal sub word line NSWL0, and data at L level are read from spare memory cell SMC connected to spare sub word line SSWL1 onto bit line BL. As a result, there is a collision between data at H level and data at L level on bit line BL, and the read out data are cancelled, and the corresponding sense amplifier could not read the normal memory cell data accurately, resulting in readout failure. Thus, the detection of the occurrence of a multi-selection can be achieved by reading the data amplified and latched by the sense amplifier externally to be compared with the expected value data.

Figure 15:
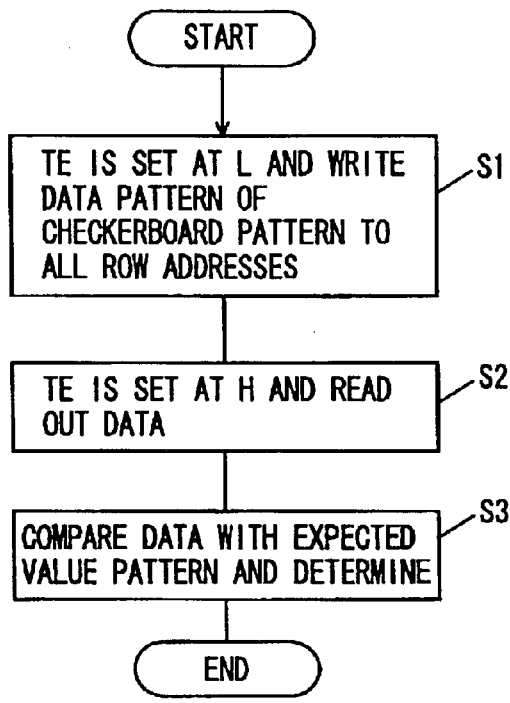
FIG. 15 is a flow chart representing operations in a multi-selection detecting test according to the second embodiment of the present invention.

FIG. 15 is a flowchart representing the method of testing the semiconductor memory device according to the second embodiment of the present invention. The method of detection of this multi-selection will be described in the following, with reference to FIG. 15.

A detection of memory cell defect is performed at a wafer level and a fuse programming of the defective address is performed. After the completion of the fuse programming, in the testing steps at the wafer level, test mode instruction signal TE is set at L level, and a data pattern is written sequentially into all the row addresses such that a checkerboard pattern having data different in logical level at least in the column direction between even row addresses and odd row addresses is stored in the memory array (Step S1).

At the time of writing the data, the fuse program is already completed, and the normal main word line corresponding to a defective row address is replaced by a spare main word line. In this case, if data are written while access is made in accordance with the external address, a multi-selection does not necessarily occur at the time of addressing a defective address. When such an intermittent multi-selection would occur, the occurrence of such intermittent multi-selection can be detected through repeated testing with various checkerboard patterns.

However, detection of a multi-selection can be ensured, as will be described below, by forcibly driving the main word line corresponding to the defective row address to the selected state (by stopping a redundant replacement), and writing data to the memory cell corresponding to the defective row address. In this arrangement, if data are written to the spare sub word lines, the normal sub word lines are forcibly kept in the non-selected state.

At Step S1, after a data pattern which provides a checkerboard pattern at least in the column direction is written to all the row addresses, test mode instruction signal TE is set at H level. In this condition, data are read from all the row addresses (Step S2). In Step S2, the row addresses are simply changed sequentially in order to detect a multi-selection. The normal main word line corresponding to the defective row address is replaced by a spare main word line.

Then, the read data pattern is compared with the expected value data pattern, and the occurrence of a multi-selection is determined based on the comparison result (Step S3).

At Step S2, test mode instruction signal TE is set at H level, address conversion is performed, and data are read. As a result, when there is a multi-selection in accessing a defective row address, data collision occurs and a data pattern different from the expected value data pattern is read out. Consequently, even if the data of the defective memory cell of the defective row address coincides with the data stored in the corresponding spare memory cell, there is a non-coincidence of data in the remaining memory cells, which ensures detection of a multi-selection.

In the test method shown in FIG. 15, checkerboard pattern data are written in all the row addresses (all the sub word lines including the normal sub word line corresponding to the defective address) so as to detect a multi-selection. This is because the detection of the multi-selection is performed at the same time with another test such as a memory cell leakage test. However, when it is permitted to perform a dedicated test of detecting a multi-selection, a checkerboard data pattern can be written only to the normal and spare memory cells corresponding to this defective row address as shown in FIG. 16, and data can be read so as to detect a multi-selection.

Figure 16:
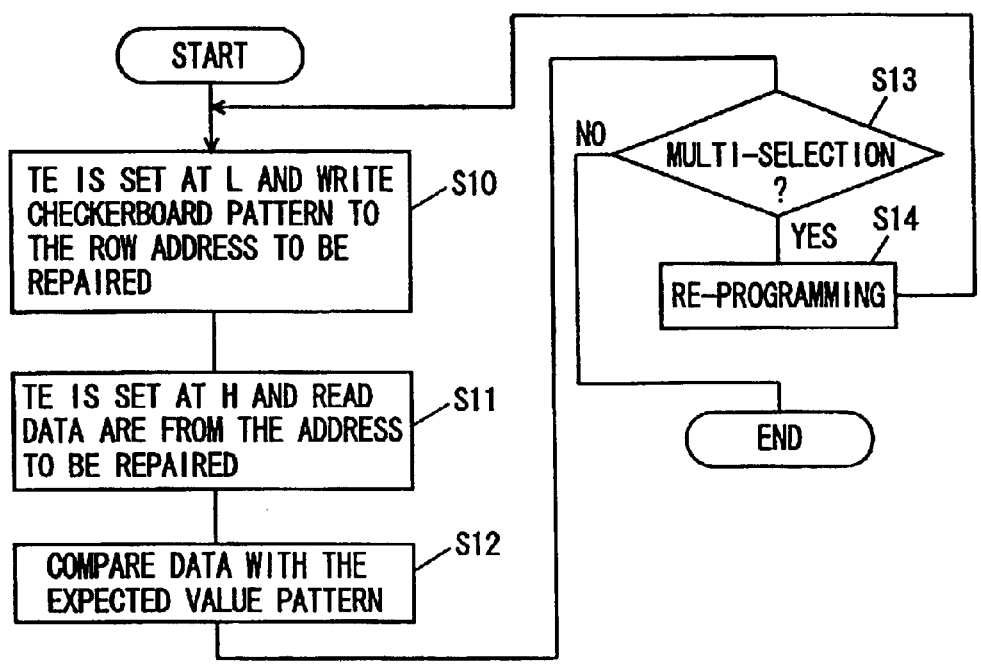
FIG. 16 is a flow chart showing operations in a multi-selection test according to a modification of the second embodiment of the present invention.

More specifically, as shown in FIG. 16, test mode instruction signal TE is set at L level, and a checkerboard pattern is written sequentially to the row addresses to be repaired (Step S1). Since the repairing of defects is done on a main word line basis, the spare sub word lines arranged corresponding to the defective main word line are sequentially designated and a checkerboard data pattern is written. Similarly, data are written to the corresponding spare sub word lines. In this case, data may be written by simply performing redundant replacement and designating the defective address. In writing data to the spare sub word lines, if there is a multi-selection, the same data are stored in the corresponding defective normal sub word line.

In the case where a multi-selection occurs not in data writing but in data reading, data are not written to the normal sub word line driven to the selected state in the data reading mode. Therefore, data of different patterns are stored in the normal and spare memory cells connected to the normal and spare sub word lines selected at the same time, so that the data pattern different from the expected value data pattern is read, making it possible to detect the multi-selection.

Then, test mode instruction signal TE is set at H level and data are read sequentially from the addresses to be repaired (Step S11). In data reading, redundant replacement is performed. Then, the data are compared with the expected value pattern (Step S12), and the occurrence of a multi-selection is determined based on the comparison result (Step S13).

When a multi-selection is determined to occur, the fuse program is executed again (Step S14), and after the completion of the operation at Step S14, the processing step goes back to Step S10. On the other hand, when it is determined that no multi-selection occurs at Step S13, the fuse program is determined to be accurately performed, and the test step is completed.

The time for testing multi-selection detection can be reduced by detecting the presence or absence of a multi-selection only for the row addresses to be repaired. Since the number of addresses to be accessed is small, multi-selection detection can be reliably done by using various data patterns within a limited time period.

In the above-described test method, such a procedure may be performed that test mode instruction signal TE is set at H level to write checkerboard pattern data, and then test mode instruction signal TE is set at L level to read data. In such a case as well, if a multi-selection occurs, the even addresses and the odd addresses of the spare sub word lines are exchanged between data writing mode of operation and data reading mode of operation. This ensures detection of the occurrence of a multi-selection.

The above description refers to a four-way hierarchical word line configuration where four sub word lines are arranged for one main word line. The same effects could be obtained for eight-way hierarchical word line configuration where eight sub word lines are arranged corresponding to one main word line.

As described above, according to the second embodiment, spare sub word line addresses can be changed between data writing mode of operation and data reading mode of operation in accordance with the test mode instruction signal, and a data pattern to be a checkerboard pattern is written in the even addresses and the odd addresses. Thus, a multi-selection can be detected accurately, thereby detecting a defective address programming failure.

[Third Embodiment]

Figure 17:
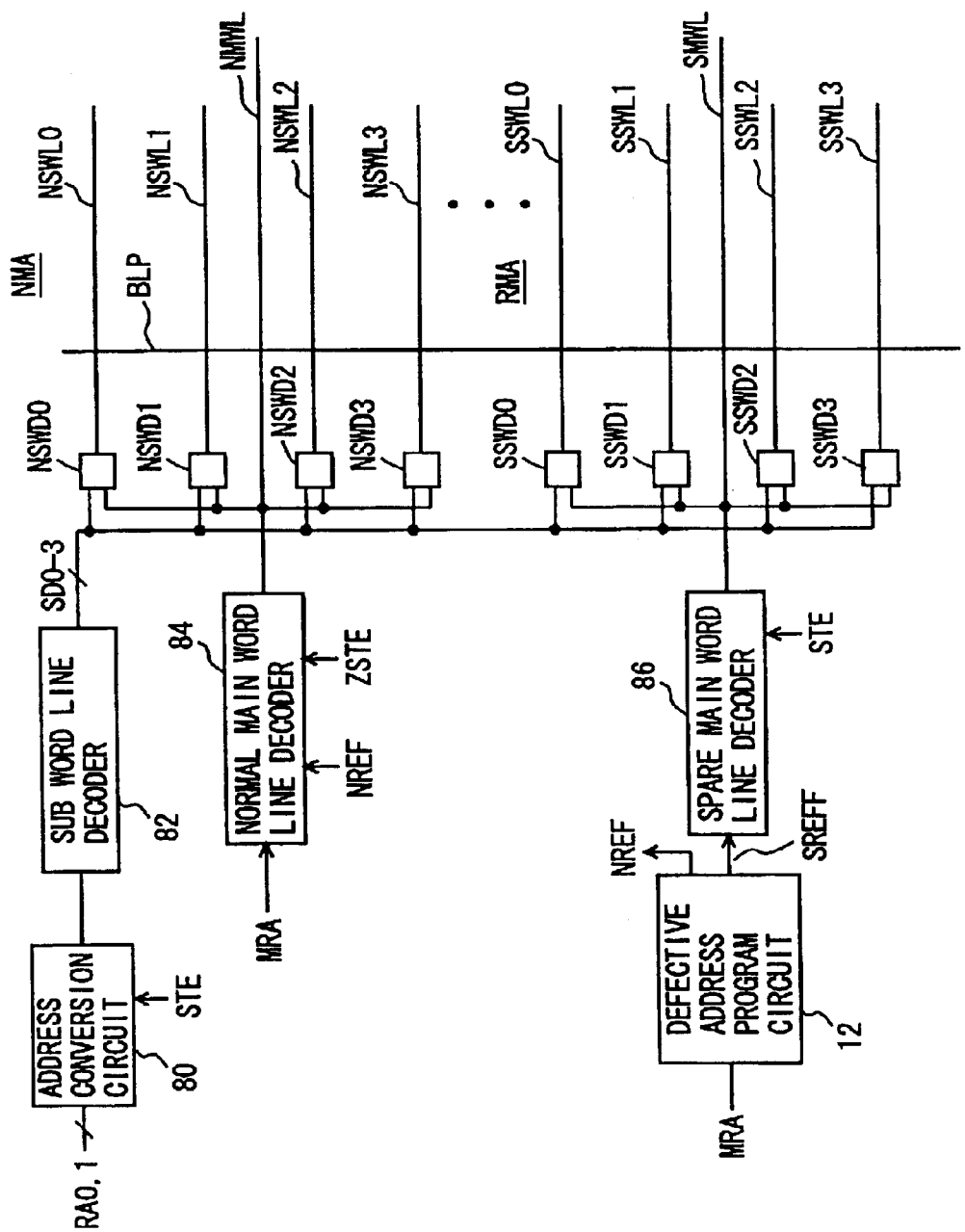
FIG. 17 is a schematic diagram of a configuration of a main part of a semiconductor memory device according to a third embodiment of the present invention.

FIG. 17 is a schematic diagram showing the configuration of the main part of the semiconductor memory device according to the third embodiment of the present invention. In FIG. 17, sub decode signals SD0 to SD3 and ZSD0 to ZSD3 from a sub word line decoder 82 are commonly applied to a normal memory array NMA and a redundant memory array RMA. In FIG. 17, complementary sub decode signals ZSD0 to ZSD3 are not shown.

Sub word line decoder 82 receives the output signal of an address conversion circuit 80 which in turn receives row address bits RA0 and RA1 (RA0, 1). Address conversion circuit 80 performs an address converting operation in accordance with spare row forcing signal STE. When spare row forcing signal STE is activated (H level), the spare main word line is forcibly selected.

The normal memory array is provided with a normal main word line decoder 84 which receives a complementary spare row forcing signal ZSTE. This normal main word line decoder has its decoding operation inhibited when complementary spare row forcing signal ZSTE is at L level. On the other hand, when complementary spare row forcing signal ZSTE is at H level, normal row enable signal NRE is set at the active state all the time, and normal main word line NMWL is driven to the selected state, regardless of the programming of a defective address. In other words, the normal main word line corresponding to a defective address is driven to the selected state.

In the configuration shown in FIG. 17, address conversion circuit 80 performs address conversion only when spare row forcing signal STE is activated and the spare sub word line is selected. When complementary spare row forcing signal ZSTE attains H level, address conversion circuit 80 does not perform converting operations because spare row forcing signal STE is at L level. According to the configuration shown in FIG. 17, sub word line decoder 82 can be provided commonly to normal memory array NMA and redundant memory array RMA, thereby preventing an increase in circuit occupation area.

Figure 18:
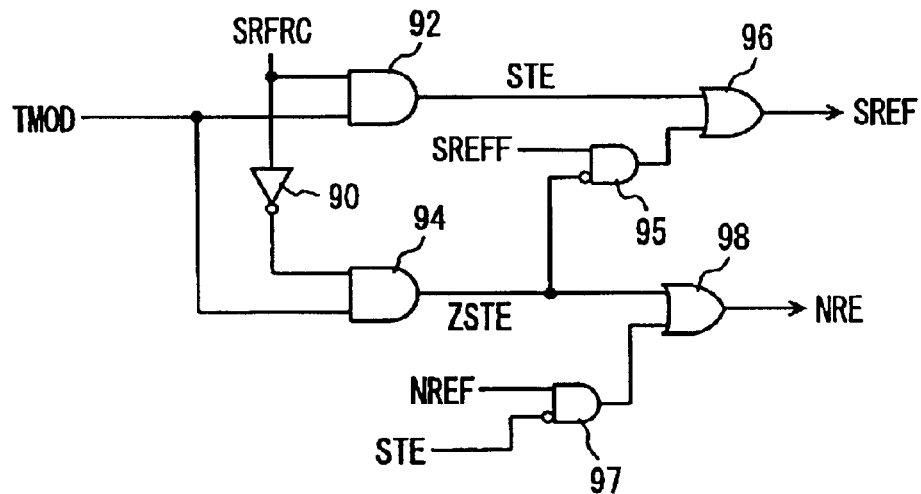
FIG. 18 is a diagram showing an example of a configuration of a signal conversion section of a normal main word line decoder and a spare main word line decoder shown in FIG. 17.

FIG. 18 is an example of a construction of the section for generating spare row forcing signals ZSTE and STE. In FIG. 18, spare row forcing signal generation section includes an AND circuit 92 which receives a test mode instruction signal TMOD and a forcing instruction signal SRFRC; an inverter 90 which inverts the forcing signal SRFRC; and an AND circuit 94 which receives the output signal of inverter 90 and test mode instruction signal TMOD. AND circuit 92 outputs spare row forcing signal STE, and AND circuit 94 outputs complementary spare row forcing signal ZSTE.

Spare row forcing signal generation section further includes a gate circuit 95 which receives spare row enable fast signal ZSEFF from defective address program circuit 12 and the complementary spare row forcing signal from AND circuit 94; an OR circuit 96 which receives the output signal of gate circuit 95 and spare row forcing signal STE from AND circuit 92, and generates spare row enable fast signal SREF; a gate circuit 97 which receives normal row enable fast signal NREF and the output signal STE of AND circuit 92; and an OR circuit 98 which receives the output signal of gate circuit 97 and output signal ZSTE of AND circuit 94, and generates normal row enable signal NRE.

When complementary spare forcing signal ZSTE is at L level, gate circuit 95 operates as a buffer circuit, and generates an output signal in accordance with spare row enable fast signal SREFF. On the other hand, gate circuit 95 is put in the disable state to output an L level signal when complementary spare forcing signal ZSTE is at H level.

Gate circuit 97 operates as a buffer circuit and generates an output signal in accordance with normal row enable fast signal NREF, when spare forcing signal STE is at L level. When spare forcing signal STE is at H level, gate circuit 97 is put in the disable state, and fixes the output signal at L level.

Spare row enable fast signal SREF from OR circuit 96 is generated inside spare main word line decoder 86, to determine selection and non-selection of spare main word line SMWL. When plural spare main word lines are provided, spare row enable fast signal SREF outputted from OR circuit 96 is commonly applied to the plural spare main word line decoders.

OR circuit 98 may be provided corresponding to each normal main word line, and normal row enable signal NRE from OR circuit 98 may be commonly applied to normal main word line decoders 80 arranged corresponding to normal main word lines in normal memory array NMA.

Defective address program circuit 12 has the same configuration as the one shown in FIG. 5, except that their output signals are referred to with different reference symbols.

Address conversion circuit 80 has the same configuration as the one shown in FIG. 8, except that test mode instruction signal TE is replaced by spare row forcing signal STE.

Figure 19:
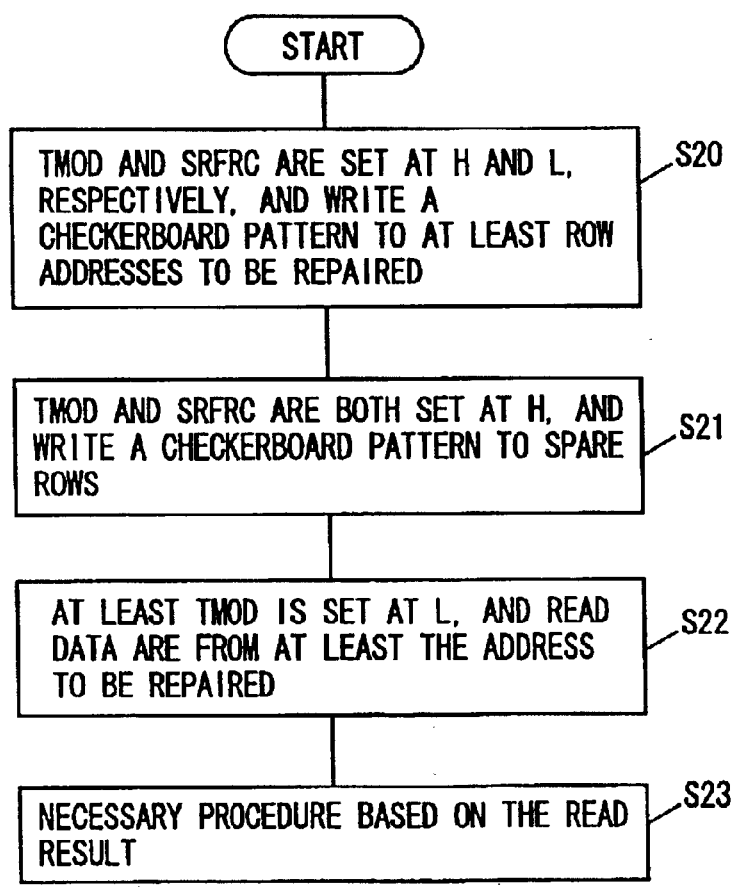
FIG. 19 is a flow chart showing operations in a multi-selection test according to the third embodiment of the present invention.

FIG. 19 is a flowchart representing the method of testing the semiconductor memory device according to the third embodiment of the present invention. Operations of the semiconductor memory device shown in FIG. 17 will be described in the following with reference to FIG. 19.

First, a checkerboard pattern is written at least to the row addresses to be repaired with test mode instruction signal TMOD and forcing setting signal SRFRC set at L level (Step S20). Here, the checkerboard pattern can be written to the even addresses and the odd addresses, with respect to the sub word lines corresponding to the main word line of the defective address. Alternatively, the checkerboard pattern may be written to all the row addresses including the sub word lines of the defective row address.

Test mode instruction signal TMOD set at H level and forcing setting signal SRFRC set at L level cause output signal ZSTE of AND circuit 94 to attain H level and normal row enable signal NRE outputted from OR circuit 98 to attain H level. This allows the normal main word line to be selected in accordance with the external address signal, regardless of the programming of the defective address.

Next, test mode instruction signal TMOD and forcing setting signal SRFRC are both set at H level. In this condition, spare row forcing signal STE outputted from AND circuit 92 attains H level and spare row enable signal SREF of OR circuit 96 attains H level. Consequently, spare main word line decoder 80 drives spare main word line SMWL to the selected state. At this time, address conversion circuit 80 performs address converting operation, and data are written to the spare sub word lines with the even addresses and the odd addresses exchanged with each other.

When the spare sub word lines are selected, the output signal of inverter 90 is at L level and output signal ZSTE of AND circuit 94 attains L level. At this time, the output signal of gate circuit 97 is at L level, regardless of the logical level of output signal NREF of the defective address program circuit, and normal row enable signal NRE is set at L level. Consequently, the occurrence of a multi-selection is prevented when the defective address is accessed.

Since spare row forcing signal ZSTE is at L level, gate circuit 95 changes its output signal SREF in accordance with output signal SREFF of the defective address program circuit.

Hence, while preventing the occurrence of a multi-selection, checkerboard pattern data can be written to the spare sub word lines with the even addresses and the odd addresses exchanged with each other.

Then, test mode instruction signal TMOD is set at L level. In this state, output signals STE and ZSTE of AND circuits 92 and 94 both attain L level. Therefore, gate circuits 95 and 97 operate as buffer circuits and OR circuits 96 and 98 also operate as buffer circuits, so that spare row enable signal SREF and normal row enable signal NRE change according to the signals SREFF and NREF outputted from the defective address program circuits. In this case, the state of forcing setting signal SRFRC is arbitrary.

Data of at least the row addresses to be repaired are read sequentially (redundant replacement is done), and the read data are compared with the expected value data (Step S22). Subsequently, the presence or absence of a multi-selection is determined based on the comparison result of the read data pattern and the expected data pattern, and a necessary processing step such as re-programming of the fuse elements is taken based on the determined result (Step S23).

In the case of the operation sequence shown in FIG. 19, address conversion is performed in data writing mode of operation. Therefore, at least for spare word lines SSWL0 to SSWL3, the data pattern written to the even addresses in the normal memory array MA are written to the odd addresses, and the data pattern written to the odd addresses in the normal memory array MA are written to the even addresses. Thus, when there occurs a multi-selection, even if spare sub word line SSWL0 and normal sub word line NSWL0 are selected at a time, normal sub word line NSWL0 stores the data pattern of the even addresses, and spare sub word line SSWL0 stores the data pattern of the odd addresses, resulting in accurate detection of a multi-selection.

In the operation flow shown in FIG. 19, this operation flow may be done as the test sequence dedicated to a multi-selection, or all row address space can be tested at the same time as another test such as memory cell leakage test. Note that at Step S22, only the sub word line space where defective row addresses are replaced is accessed.

In the configuration shown in FIGS. 17 to 19, it is unnecessary to provide the sub word line decoder exclusively for the spare sub redundant memory array, resulting in a reduced the circuit occupation area. Data are surely written to a defective normal sub word line which is driven to the selected state, so that opposite data patterns can be written to the defective normal sub word line and the corresponding spare sub word line. Hence, a multi-selection can be detected without fail even when the multi-selection occurs intermittently.

When a multi-selection occurs all the time, it is not required to write data to the defective normal sub word line forcibly. Therefore, in this case, it is sufficient to set spare row selection signal STE at H level only when data are written to the defective row address, and the configuration shown in FIG. 18 is not particularly required to use.

As described above, according to the third embodiment of the present invention, address conversion is adapted to be performed when data are written at least to the spare word line. The sub word line decoder can be shared between the normal memory array and the sub redundant memory array, resulting in a reduced the circuit occupation area.

[Fourth Embodiment]

Figure 20:
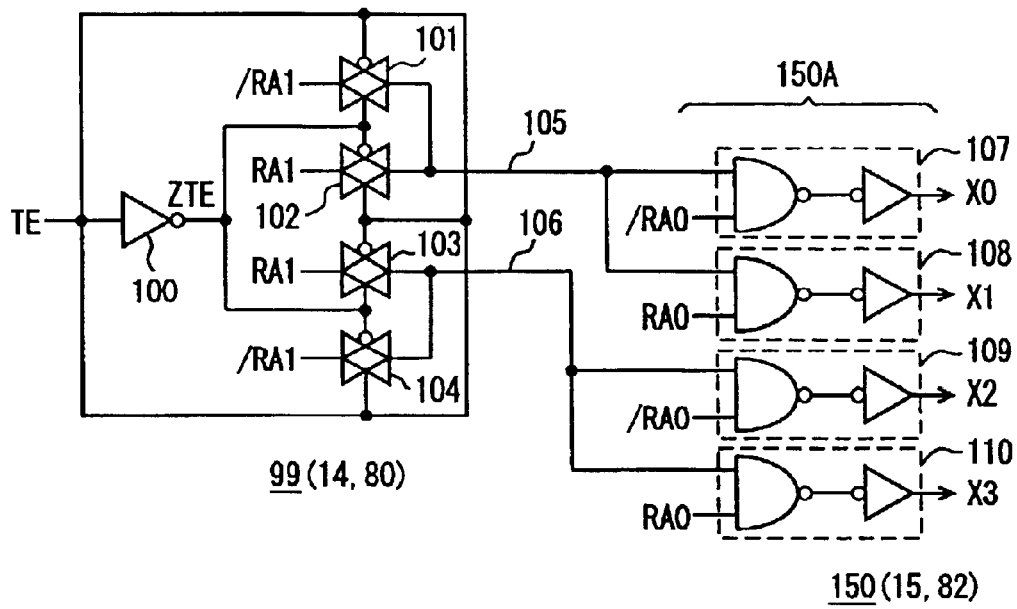
FIG. 20 is a diagram showing a configuration of an address conversion circuit according to a fourth embodiment of the present invention.

FIG. 20 is a diagram showing the configuration of the address conversion circuit according to the fourth embodiment of the present invention. An address conversion circuit 99 shown in FIG. 20 corresponds to spare address conversion circuit 14 shown in FIG. 3 or address conversion circuit 80 shown in FIG. 17.

In FIG. 20 address conversion circuit 99 includes an inverter 100 which receives test mode instruction signal TE, and generates complementary test mode instruction signal ZTE; a CMOS transmission gate 101 which is selectively rendered conductive in accordance with complementary test mode instruction signals TE and ZTE, and transmits row address bit /RA1 to node 105 when conductive; a COMS transmission gate 102 which is rendered conductive complementarily to CMOS transmission 101 in accordance with complementary test mode instruction signals TE and ZTE, and transmits row address bit RA1 to node 105 when rendered conductive; a CMOS transmission gate 103 which is selectively rendered conductive in accordance with complementary test mode instruction signals TE and ZTE, and transmits row address bit RA1 to node 106 when conductive; and a COMS transmission gate 104 which is rendered conductive complementarily to CMOS transmission 103 in accordance with complementary test mode instruction signals TE and ZTE, and transmits row address bit /RA1 to node 106 when conductive.

When test mode instruction signal TE is at L level, CMOS transmission gates 101 and 103 turn conductive, to transmit row address bits /RA1 and RA1 to nodes 105 and 106, respectively. When test mode instruction signal TE attains H level, CMOS transmission gates 102 and 104 turn conductive, to transmit row address bits RA1 and /RA1 to nodes 105 and 106, respectively. Thus, in address conversion circuit 99 shown in FIG. 20, when test mode instruction signal TE attains H level, row address bits RA1 and /RA1 are transmitted with their positions exchanged. Through the switching of bit positions of row address bits RA1 and /RA1, the logical level of address bit RA1 is equivalently inverted.

The output signal of address conversion circuit 99 is transmitted to sub decode circuit 150. Sub decode circuit 150 corresponds to spare sub word line decoder 15 shown in FIG. 3 or sub word line decoder 82 shown in FIG. 17. FIG. 20 shows the configuration of predecode circuit 150A for predecoding received row address bits.

Predecode circuit 150A includes an AND circuit 107 which receives the address bit on node 105 and row address bit /RA0, and generates a predecoded signal X0; a predecode circuit 108 which receives the address bit on node 105 and row address bit RA0, and generates a predecoded signal X1; an AND circuit 109 which receives the address bit on node 106 and row address bit /RA0, and generates a predecoded signal X2; and an AND circuit 110 which receives the address bit on node 106 and row address bit RA0, and generates a predecoded signal X3.

Predecoded signals X0 to X3, when selected, designate sub word lines SWL0 to SWL3, respectively.

The circuit portion inside sub word line decode circuit 150 which generates sub decode signals in accordance with predecoded signals X0 to X3 has the same configuration as the one shown in FIG. 9.

Figure 21:
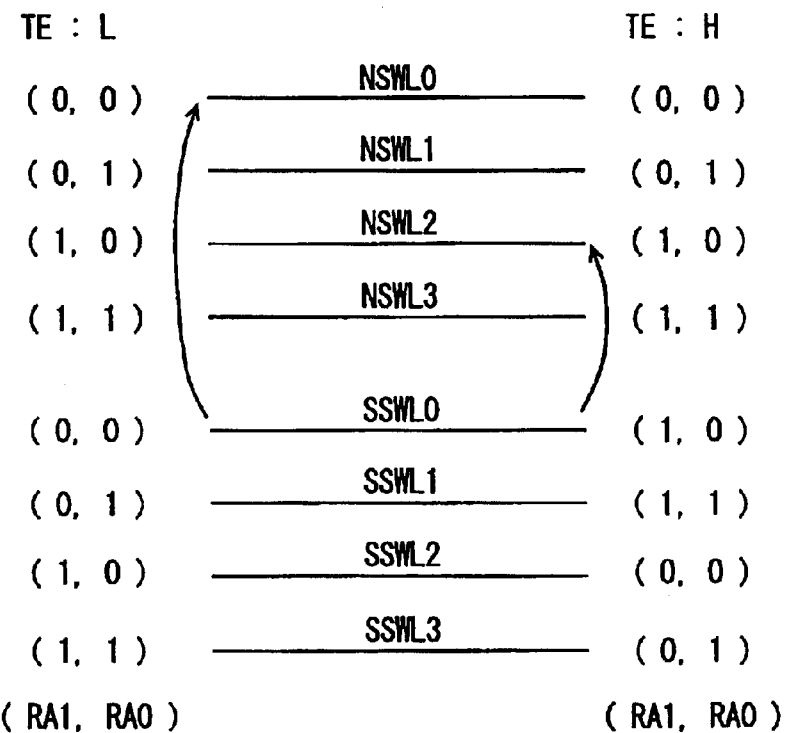
FIG. 21 is a diagram showing the correspondence relationship between normal word lines and sub word lines according to the fourth embodiment of the present invention.

FIG. 21 is a schematic diagram showing the correspondence relation between sub word lines NSWL0 to NSWL3, SSWL0 to SSWL3 and address bits (RA1, RA0) when using address conversion circuit 99 shown in FIG. 20. Since address conversion is not performed for normal sub word lines NSWL0 to NSWL3, normal sub word lines NSWL0, NSWL1, NSWL2, and NSWL3 are designated when row address bits (RA1, RA0) are (0,0), (0,1), (1,0), and (1,1), respectively, irrespective of whether test mode instruction signal TE is at L level or H level.

When test mode instruction signal TE is at L level, row address bits /RA1 and RA1 are transmitted to nodes 105 and 106, respectively. Consequently, predecoded signals X0 to X3 are selected when decimal addresses 0 to 3 are designated, respectively. In other words, when test mode instruction signal TE is at L level, spare sub word lines SSWL0 to SSWL3 correspond to normal sub word lines NSWL0 to NSWL3, respectively.

When test mode instruction signal TE is set at H level, address bit RA1 is transmitted to node 105, and address bit /RA1 is transmitted to node 106. Since address conversion is performed in this case, when row address bits (RA1, RA0) are (1,0), (1,1), (0,0), and (0,1), spare sub word lines SSWL0, SSWL1, SSWL2, and SSWL3 are selected, respectively.

When test mode instruction signal TE is at L level, there is caused a multi-selection of spare sub word line SSWL0 and normal sub word line NSWL0. When test mode instruction signal TE is set at H level, there is caused a multi-selection of spare sub word line SSWL0 and normal sub word line NSWL2.

Normal sub word line NSWL2 and spare sub word line SSWL0 have different arrangement of connected memory cells as shown in FIG. 4. Consequently, data are written on addresses (RA1, RA0)=(0,0) and (1,0) so as to form a checkerboard pattern. Similarly, a data pattern is written on addresses (RA1, RA0)=(0,1) and (1,1) so as to form a checkerboard pattern.

Figure 22:
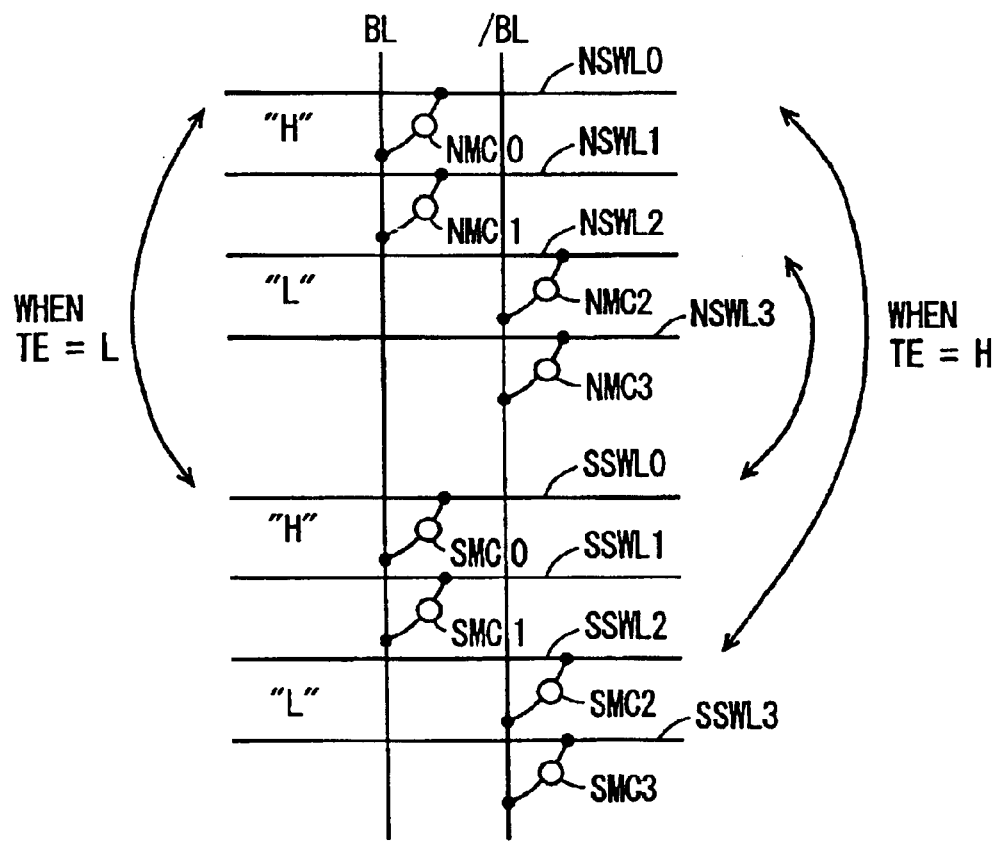
FIG. 22 is a diagram showing the data written to normal memory cells and spare memory cells and the corresponding selection of word lines according to the fourth embodiment of the present invention.

FIG. 22 is a schematic diagram showing the connection of memory cells in one column of normal sub word lines NSWL0 to NSWL3 and spare sub word lines SSWL0 to SSWL3. In FIG. 22, normal memory cells NMC0 and NMC1 are arranged corresponding to the crossings of normal sub word lines NSWL0 and NSWL1 and bit line BL, respectively. On the other hand, normal memory cells NMC2 and NMC3 are arranged corresponding to the crossings of normal sub word lines NSWL2 and NSWL3 and complementary bit line /BL, respectively.

Spare sub word lines SSWL0 to SSWL3 have spare memory cells connected in the same arrangement as that of the memory cells on normal sub word lines NSWL0 to NSWL3. Spare sub word lines SSWL0 and SSWL1 have spare memory cells SMC0 and SMC1 arranged corresponding to the crossings with bit line BL, and spare sub word lines SSWL2 and SSWL3 have spare memory cells SMC2 and SMC3 arranged corresponding to the crossings with bit line /BL.

Data at H level is written to normal memory cell NMC0, and data at L level is written to normal memory cell NMC2 from outside. Since data of logical level opposite to the external data appear on complementary bit line /BL, normal memory cell NMC2 actually stores data at H level.

Similarly, data at H level is written to spare memory cell SMC0 from outside, and data at L level is written to spare memory cell SMC2 from outside. In this case as well, spare memory cell SMC2 actually stores data of H level.

When test mode instruction signal TE is at L level, the same data pattern is written to spare sub word lines SSWL0 and NSWL0. To normal sub word line NSWL2 and spare sub word line SSWL2, the data pattern forming a checkerboard pattern with the data pattern of these sub word lines NSWL0 and SSWL0 are stored.

In the case where a defective address is designated with test mode instruction signal TE set at H level, when normal sub word line NSWL0 is designated, spare sub word line SSWL2 is driven to the selected state. When normal sub word line NSWL2 is designated, spare sub word line SSWL0 is selected.

Figure 23:
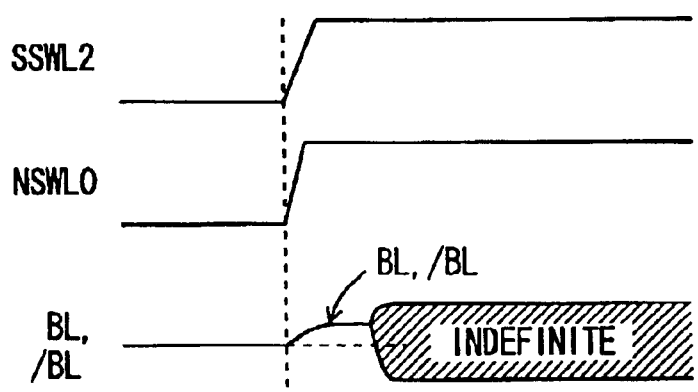
FIG. 23 is a diagram showing signal waveforms in reading memory cell data in the configuration shown in FIG. 22.
Figure 24:
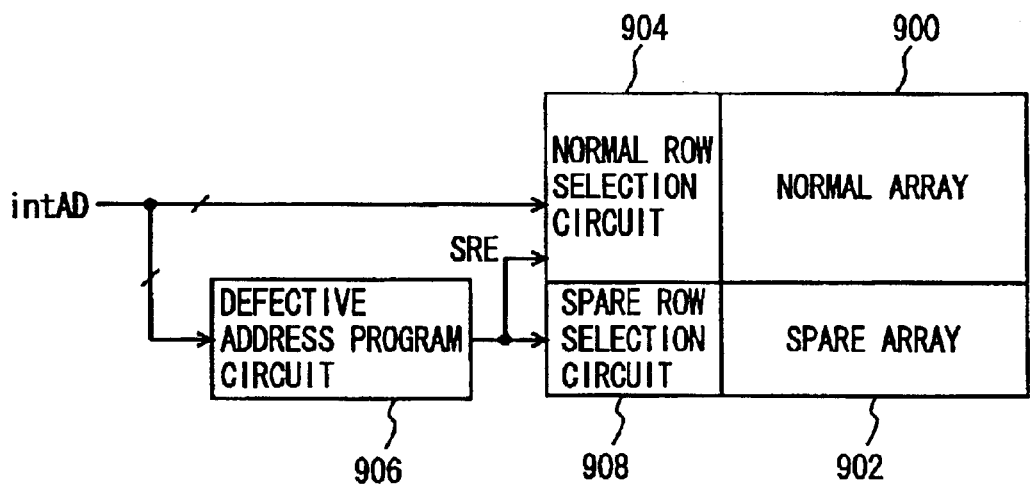
FIG. 24 is a schematic diagram showing a main part of a conventional semiconductor memory device.
Figure 25:
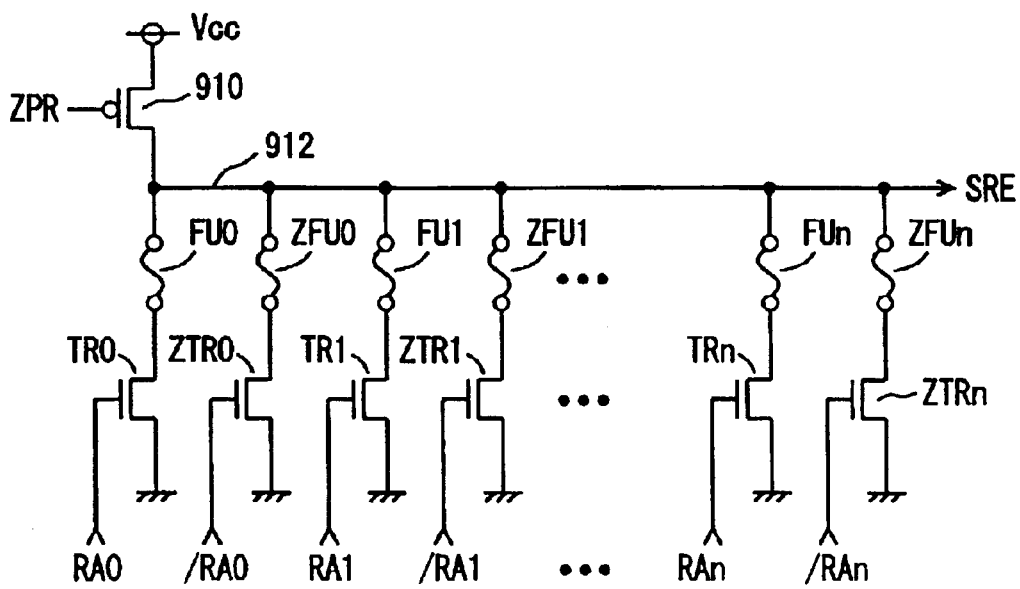
FIG. 25 is a diagram showing an example of a configuration of a defective address program circuit shown in FIG. 24.
Figure 26:
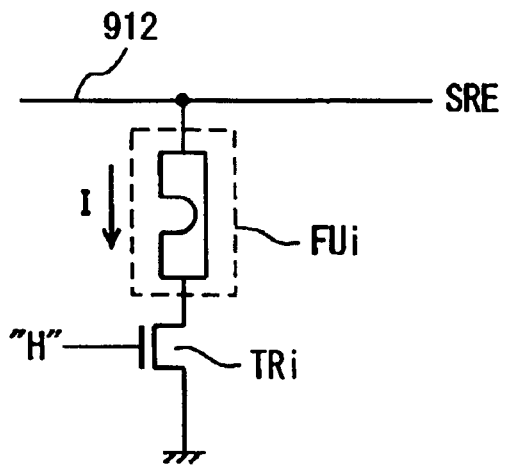
FIG. 26 is a diagram showing a program defect state in a conventional defective address program circuit.
Figure 27:
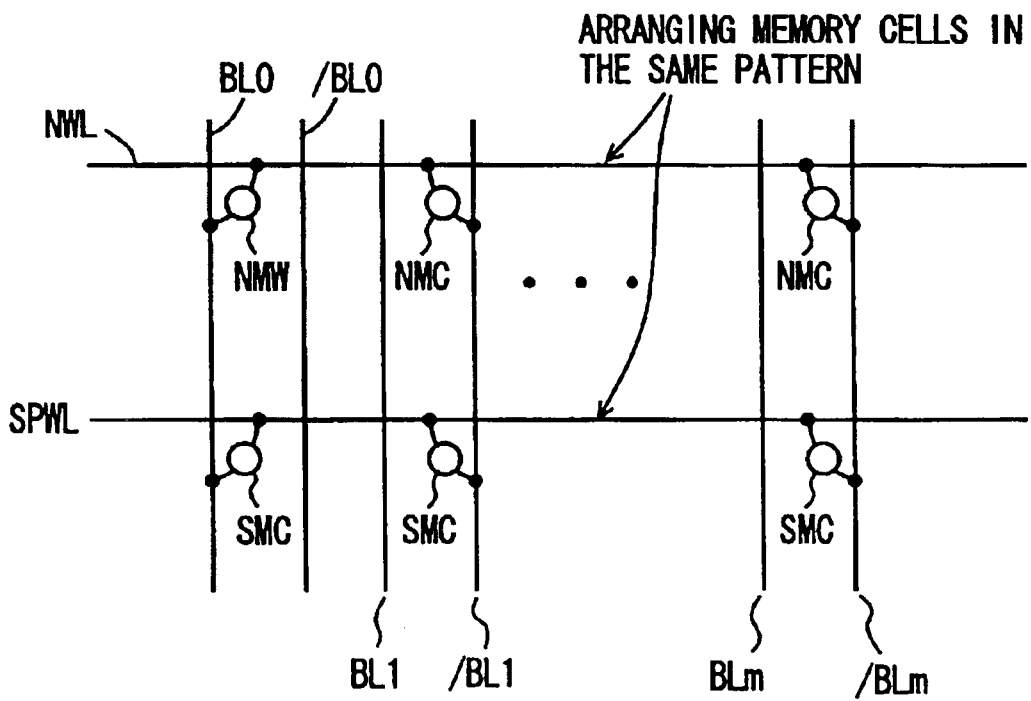
FIG. 27 is a schematic diagram showing an arrangement of normal memory cells and spare memory cells in a conventional semiconductor memory device.

Now, the case is considered that spare sub word line SSWL0 is selected in data reading with test mode instruction signal set at H level. When there occurs a multi-selection, normal sub word line NSWL2 is selected. Consequently, the data at H level stored in spare memory cell SMC0 are read out on bit line BL, and as shown in FIG. 23, the voltage level of bit line BL increases from the precharge voltage of intermediate voltage level. Similarly, the data at H level are transmitted from normal memory cell NMC2 onto complementary bit line /BL, and the voltage level of complementary bit line /BL increases.

Since bit lines BL and /BL both increase in voltage level, the associated sense amplifier fails to differentially amplify the potential difference between bit lines BL and /BL, and uncertain data appears. Subsequently, the presence or absence of a multi-selection can be determined through comparison between the expected value data pattern and the read out data at an outside.

As to the other spare sub word lines, the same operation is applied. A data pattern is written to adjacent even addresses so as to form a checkerboard pattern, and a data pattern is written to adjacent odd addresses so as to form a checkerboard pattern. As a result, bit lines BL and /BL have voltage changes varying in the same direction appearing thereon, resulting in inaccurate sensing operation by the sense amplifier. A data pattern different from the expected value pattern is read externally, and a multi-selection can be detected.

The operations of detecting a multi-selection in the fourth embodiment can be done in the same manner as in the second or third embodiment. Therefore, in wiring test data, the data may be written to row addresses with test mode instruction signal TE set at H level. Furthermore, writing/reading of data may be performed only to the row addresses related to a defective address.

Also in the fourth embodiment, detection of a multi-selection can be done not only in the hierarchical word line configuration but also in the non-hierarchical word line configuration by switching the correspondence relation between the output signals of the defective address program circuits and the spare word lines.

The number of sub word lines is not restricted to 4, and may be 8, for example.

As described above, according to the fourth embodiment of the present invention, the positions of an upper address bit of the spare sub word lines are switched according to the test mode instruction signal. Thus, the word line pair that causes a multi-selection can be switched. Since the memory cells connected to these sub word lines are arranged in different patterns from each other, it becomes possible to normally cause voltage changes varying in the same direction on the bit lines in a pair when a multi-selection occurs, resulting in an accurate detection of a multi-selection.

[Other Applications]

In the above description, DRAM (Dynamic Random Access Memory) is shown as an example of semiconductor memory device. The present invention, however, can be applied to any semiconductor memory device as long as a defective normal word line is replaced by a spare word line through the programming of fuse elements, and normal memory cells and spare memory cells are so arranged as to share the columns.

As described above, according to the present invention, the addresses of the spare word lines are adapted to be converted, different data patterns can be written to the spare row and normal memory cell row which cause a multi-selection, and a program failure of a defective address can be reliably detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of normal memory cells arranged in rows and columns,
   a plurality of spare memory cells arranged in rows and columns, said plurality of spare memory cells being arranged, in plural rows, sharing at least the columns with said plurality of normal memory cells;
   a plurality of normal word lines arranged corresponding to the normal memory cell rows, and connected to normal memory cells in corresponding rows;
   a plurality of spare word lines arranged corresponding to the spare memory cell rows, and connected to spare memory cells in corresponding rows;
   defective address program circuitry for programming an address of a defective normal word line, said defective address program circuitry including a circuit for generating an coincidence indicating signal indicating a determination result of coincidence and non-coincidence between an external address and a programmed defective address;
   word line selection circuitry for selecting a corresponding word line from the normal word lines and the spare word lines in accordance with said external address and said coincidence indicating signal; and
   address conversion circuitry for changing correspondence relationship between said external address and said plurality of spare word lines.

2. The semiconductor memory device according to claim 1, wherein said address conversion circuitry changes the correspondence relationship between said external address and the spare word lines in accordance with a test operation mode instruction signal such that a different spare word line from a spare word line selected in a normal operation mode can be selected in the test mode of operation.

3. The semiconductor memory device according to claim 1, further comprising a plurality of bit line pairs arranged corresponding to the normal memory cell columns and the spare memory cell columns, and connected to normal and spare memory cells in corresponding columns, wherein
   said address conversion circuitry changes said correspondence relationship such that a spare word line having spare memory cells connected in a same pattern with respect to memory cell arrangement as said defective word line in a column direction is selected.

4. The semiconductor memory device according to claim 1, further comprising a plurality of bit line pairs arranged corresponding to the columns of the normal memory cells and the spare memory cells, and connected to normal and spare memory cells in corresponding columns, wherein
   said address conversion circuitry changes the correspondence relationship such that a spare word line having spare memory cells connected in a different pattern with respect to memory cell arrangement from said defective word line in a column direction is selected.

5. The semiconductor memory device according to claim 1, further comprising a plurality of bit line pairs arranged corresponding to the columns of the normal and spare memory cells, and connected to normal and spare memory cells in corresponding columns, wherein
   said address conversion circuitry performs address conversion such that a spare word line having spare memory cells connected in a same pattern with respect to memory cell arrangement as the defective word line of said defective address in a column direction is selected in a normal operation mode, and another spare word line having spare memory cells connected in the same pattern with respect to memory cell arrangement as said defective word line in the column direction is selected in a test operation mode.

6. The semiconductor memory device according to claim 1, further comprising a plurality of bit line pairs arranged corresponding to the columns of the normal and spare memory cells, and connected to normal and spare memory cells in corresponding columns, wherein said address conversion circuitry performs address conversion such that a spare word line having spare memory cells connected in a same pattern with respect to memory cell arrangement as the defective normal word line of said defective address in a column direction is selected in a normal operation mode, and a spare word line having spare memory cells connected in a different pattern with respect to memory cell arrangement from said defective normal word line in the column direction is selected in a test operation mode.

7. The semiconductor memory device according to claim 1, wherein said address conversion circuitry performs conversion of addresses allotted to the spare word lines between even addresses and odd addresses.

8. The semiconductor memory device according to claim 1, wherein the normal word lines and the spare word lines are arranged in a hierarchical word line configuration comprised of a main word line disposed corresponding to a predetermined number of memory cell rows and sub word lines each having memory cells in a corresponding row coupled, said defective address program circuitry programs and stores an address of a main word line arranged corresponding to the defective normal memory cell row, said word line selection circuitry includes:

a normal main word line selection circuit for selecting a normal main word line in accordance with said coincidence indicating signal and a main word line address designating a main word line in said external address;

normal sub word line selection circuit for generating a sub word line selection signal selecting a sub word line of the normal word lines in accordance with a sub word line address designating a sub word line in said external address;

a spare main word line selection circuit for selecting a main word line of the spare word lines in accordance with said coincidence indicating signal; and spare sub word line selection circuit for generating a spare sub word line selection signal selecting a sub word line of the spare word lines in accordance with said sub word line address, and said address conversion circuitry changes the sub word line address applied to said spare sub word line selection circuit.

9. The semiconductor memory device according to claim 8, wherein said spare sub word line selection circuit and said normal sub word line selection circuit are provided separately.

10. The semiconductor memory device according to claim 8, wherein said spare sub word line selection circuit and said normal sub word line selection circuit are composed of a common selection circuit, and an output of said common selection circuit is transmitted commonly to the normal and spare sub word lines; and said address conversion circuitry converts the sub word line address contained in said external address in an operation mode of selecting a spare sub word line for transmission to said common selection circuit.

11. The semiconductor memory device according to claim 8, wherein said sub word line address includes a plurality of bits, said word line selection circuit include an internal address generation circuit for generating complementary internal sub word line addresses composed of a plurality of bits in accordance with said sub word line address; and said address conversion circuitry changes a position of complementary bits of the sub word line addresses.

12. The semiconductor memory device according to claim 8, wherein said address conversion circuitry exchanges positions of complementary bits generated for a specific bit of the sub word line address.

* * * * *